(12) United States Patent
Reiherzer et al.

(10) Patent No.: US 10,134,961 B2
(45) Date of Patent: Nov. 20, 2018

(54) SUBMOUNT BASED SURFACE MOUNT DEVICE (SMD) LIGHT EMITTER COMPONENTS AND METHODS

(71) Applicant: CREE, Inc., Durham, NC (US)

(72) Inventors: Jesse Colin Reiherzer, Wake Forest, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/800,284

(22) Filed: Mar. 13, 2013

(65) Prior Publication Data

US 2013/0270592 A1 Oct. 17, 2013

Related U.S. Application Data

(60) Provisional application No. 61/618,327, filed on Mar. 30, 2012, provisional application No. 61/642,995, filed on May 4, 2012.

(51) Int. Cl.
| | | |
|---|---|---|
| H01L 33/52 | (2010.01) | |
| H01L 33/60 | (2010.01) | |
| H01L 33/00 | (2010.01) | |
| H01L 33/48 | (2010.01) | |

(52) U.S. Cl.
CPC .......... *H01L 33/52* (2013.01); *H01L 33/0095* (2013.01); *H01L 33/60* (2013.01); *H01L 33/486* (2013.01); *H01L 2224/48091* (2013.01); *H01L 2933/0058* (2013.01)

(58) Field of Classification Search
CPC ......... H01L 2224/73265; H01L 21/486; H01L 2224/32188

USPC ............................................. 257/98, 99, 100
See application file for complete search history.

(56) References Cited

U.S. PATENT DOCUMENTS

| | | |
|---|---|---|
| 4,855,194 A | 8/1989 | Wright |
| 4,946,547 A | 8/1990 | Palmour |
| 5,200,022 A | 4/1993 | Kong |
| 5,210,051 A | 5/1993 | Carter, Jr. et al. |
| RE34,861 E | 2/1995 | Davis et al. |
| 5,393,993 A | 2/1995 | Edmond et al. |
| 5,523,589 A | 6/1996 | Edmond et al. |

(Continued)

FOREIGN PATENT DOCUMENTS

| | | |
|---|---|---|
| CN | 1815766 | 8/2006 |
| CN | 1947266 A | 4/2007 |

(Continued)

OTHER PUBLICATIONS

International Search Report and Written Opinion for Application No. PCT/US2013/035411 dated Oct. 15, 2013.

(Continued)

*Primary Examiner* — Bilkis Jahan
(74) *Attorney, Agent, or Firm* — Jenkins, Wilson, Taylor & Hunt, P.A.

(57) ABSTRACT

Submount based surface mount design (SMD) light emitter components and related methods are disclosed. In one aspect, a method of providing a submount based light emitter component can include providing a ceramic based submount, providing at least one light emitter chip on the submount, providing at least one electrical contact on a portion of the submount, and providing a non-ceramic based reflector cavity on a portion of the submount.

28 Claims, 7 Drawing Sheets

(56) References Cited

U.S. PATENT DOCUMENTS

| | | | |
|---|---|---|---|
| 6,093,053 | A | 7/2000 | Horioka et al. |
| 6,224,430 | B1 | 5/2001 | Kusuda et al. |
| 6,492,699 | B1* | 12/2002 | Glenn .............. H01L 27/14618 257/433 |
| 6,503,780 | B1* | 1/2003 | Glenn .............. H01L 27/14618 438/106 |
| 6,548,832 | B1 | 4/2003 | Sakamoto et al. |
| 6,638,780 | B2 | 10/2003 | Fukasawa et al. |
| 6,686,609 | B1 | 2/2004 | Sung |
| 6,909,051 | B2 | 6/2005 | Noble |
| 6,936,855 | B1* | 8/2005 | Harrah ............................ 257/88 |
| 6,953,255 | B2 | 10/2005 | Horiuchi et al. |
| D511,328 | S | 11/2005 | Wang |
| 7,034,778 | B1 | 4/2006 | Hähl |
| 7,055,987 | B2 | 6/2006 | Staufert |
| 7,066,626 | B2 | 6/2006 | Omata |
| D528,672 | S | 9/2006 | Nagai |
| D528,996 | S | 9/2006 | Egawa |
| 7,208,838 | B2 | 4/2007 | Masuda |
| D541,761 | S | 5/2007 | Saito et al. |
| 7,213,940 | B1 | 5/2007 | Van de Ven et al. |
| 7,224,000 | B2 | 5/2007 | Aanegola et al. |
| D570,506 | S | 6/2008 | Uemoto |
| D570,797 | S | 6/2008 | Song |
| D572,210 | S | 7/2008 | Lee |
| D573,553 | S | 7/2008 | Uemoto et al. |
| D573,731 | S | 7/2008 | Uemoto |
| 7,393,237 | B2 | 7/2008 | Kuo |
| D576,576 | S | 9/2008 | Shida et al. |
| 7,479,660 | B2 | 1/2009 | Kobilke |
| 7,482,636 | B2 | 1/2009 | Murayama et al. |
| D586,303 | S | 2/2009 | Fuwa et al. |
| D589,470 | S | 3/2009 | Chen |
| D591,248 | S | 4/2009 | Imai et al. |
| 7,521,728 | B2 | 4/2009 | Andrews |
| D592,615 | S | 5/2009 | Imai et al. |
| D593,043 | S | 5/2009 | Song |
| D602,451 | S | 10/2009 | Gielen |
| D603,813 | S | 11/2009 | Nishimura et al. |
| D607,420 | S | 1/2010 | Imai et al. |
| 7,655,957 | B2 | 2/2010 | Wang et al. |
| D615,051 | S | 5/2010 | Chen et al. |
| D615,052 | S | 5/2010 | Imai et al. |
| D615,504 | S | 5/2010 | Keller et al. |
| D615,505 | S | 5/2010 | Butterworth et al. |
| D618,635 | S | 6/2010 | Imai et al. |
| D622,876 | S | 8/2010 | Takahashi et al. |
| 7,780,313 | B2 | 8/2010 | Lam et al. |
| 7,791,061 | B2 | 9/2010 | Edmond |
| 7,804,147 | B2 | 9/2010 | Tarsa et al. |
| 7,812,365 | B2 | 10/2010 | Murayama |
| 7,825,578 | B2 | 11/2010 | Takashima et al. |
| D628,966 | S | 12/2010 | Kuwaharada et al. |
| D630,171 | S | 1/2011 | Hsieh |
| D631,020 | S | 1/2011 | Chuang et al. |
| 7,872,418 | B2 | 1/2011 | Hata et al. |
| D633,631 | S | 3/2011 | Shieh et al. |
| D636,899 | S | 4/2011 | Shibahara |
| D637,564 | S | 5/2011 | Tseng et al. |
| D637,565 | S | 5/2011 | Wu et al. |
| 7,943,952 | B2 | 5/2011 | Loh et al. |
| 7,955,147 | B1 | 6/2011 | Legrady et al. |
| D640,997 | S | 7/2011 | Imai et al. |
| D642,143 | S | 7/2011 | Kuwaharada et al. |
| 7,982,709 | B2 | 7/2011 | Sekiguchi et al. |
| 7,994,518 | B2 | 8/2011 | Wang et al. |
| D645,416 | S | 9/2011 | Kuwaharada et al. |
| D645,417 | S | 9/2011 | Imai et al. |
| 8,022,626 | B2 | 9/2011 | Hamby et al. |
| 8,044,418 | B2 | 10/2011 | Loh et al. |
| 8,058,088 | B2 | 11/2011 | Cannon |
| D649,943 | S | 12/2011 | Kuwaharada et al. |
| D649,944 | S | 12/2011 | Kuwaharada et al. |
| D650,760 | S | 12/2011 | Hussell et al. |
| 8,119,534 | B2 | 2/2012 | Tanaka et al. |
| D656,906 | S | 4/2012 | Leung |
| D658,601 | S | 5/2012 | Egawa et al. |
| D658,602 | S | 5/2012 | Egawa et al. |
| D658,603 | S | 5/2012 | Egawa et al. |
| D660,813 | S | 5/2012 | Otaki et al. |
| 8,167,674 | B2 | 5/2012 | Hussell et al. |
| 8,202,745 | B2 | 6/2012 | Andrews |
| D662,902 | S | 7/2012 | Shieh et al. |
| D667,802 | S | 9/2012 | Otaki et al. |
| D667,803 | S | 9/2012 | Hussell et al. |
| 8,267,550 | B2 | 9/2012 | Wang |
| D669,041 | S | 10/2012 | Imai et al. |
| D670,010 | S | 10/2012 | Lin |
| 8,354,684 | B2 | 1/2013 | West |
| D676,000 | S | 2/2013 | Hussell et al. |
| D676,395 | S | 2/2013 | Hussell et al. |
| D680,504 | S | 4/2013 | Noichi |
| 8,410,679 | B2 | 4/2013 | Ibbetson et al. |
| 8,425,271 | B2 | 4/2013 | Hussell et al. |
| D683,708 | S | 6/2013 | Sasano et al. |
| 8,455,908 | B2 | 6/2013 | Welch et al. |
| 8,461,613 | B2 | 6/2013 | Chou et al. |
| 8,508,689 | B2 | 8/2013 | Kuwaharada et al. |
| 8,517,572 | B2 | 8/2013 | Ferenc |
| D689,451 | S | 9/2013 | Shimonishi et al. |
| 8,536,787 | B2 | 9/2013 | Motoya |
| 8,563,339 | B2 | 10/2013 | Tarsa |
| 8,564,000 | B2 | 10/2013 | Hussell |
| 8,575,639 | B2 | 11/2013 | Hussell |
| D698,323 | S | 1/2014 | Noichi |
| 8,624,271 | B2 | 1/2014 | Reiherzer |
| D698,741 | S | 2/2014 | Kobayashi et al. |
| 8,669,573 | B2 | 3/2014 | Medendorp, Jr. |
| 8,680,546 | B2 | 3/2014 | Konishi et al. |
| D702,653 | S | 4/2014 | Wilcox et al. |
| D705,181 | S | 5/2014 | Hussell et al. |
| 8,729,589 | B2 | 5/2014 | Hussell et al. |
| 8,733,968 | B2 | 5/2014 | Van De Ven et al. |
| D706,231 | S | 6/2014 | Hussell et al. |
| D707,192 | S | 6/2014 | Hussell et al. |
| 8,748,915 | B2 | 6/2014 | Chan et al. |
| D710,810 | S | 8/2014 | Noichi |
| D711,840 | S | 8/2014 | Lowes et al. |
| 8,809,880 | B2 | 8/2014 | Hussell |
| D712,850 | S | 9/2014 | Welch et al. |
| D718,258 | S | 11/2014 | Lowes et al. |
| D718,725 | S | 12/2014 | Reihrezer et al. |
| 8,921,869 | B2 | 12/2014 | Welch et al. |
| D721,339 | S | 1/2015 | Hussell et al. |
| 8,940,561 | B2 | 1/2015 | Donofrio et al. |
| 8,994,057 | B2 | 3/2015 | Hussell |
| 9,000,470 | B2 | 4/2015 | Tudorica |
| 9,024,349 | B2 | 5/2015 | Chitnis et al. |
| D736,725 | S | 8/2015 | Wilcox et al. |
| D738,832 | S | 9/2015 | Hussell et al. |
| 9,159,888 | B2 | 10/2015 | Chitnis et al. |
| 9,194,567 | B2 | 11/2015 | Hussell et al. |
| 9,203,004 | B2 | 12/2015 | Hussell et al. |
| 9,209,354 | B2 | 12/2015 | Hussell et al. |
| 9,300,062 | B2 | 3/2016 | Hussell et al. |
| 9,496,466 | B2 | 11/2016 | Hussell |
| 9,502,624 | B2 | 11/2016 | Kuramoto et al. |
| 9,735,198 | B2 | 8/2017 | Joo et al. |
| 9,780,268 | B2 | 10/2017 | Hussell et al. |
| 2003/0067761 | A1 | 4/2003 | Horiuchi et al. |
| 2004/0056265 | A1* | 3/2004 | Arndt et al. .................... 257/98 |
| 2004/0069993 | A1 | 4/2004 | Murano |
| 2004/0079957 | A1 | 4/2004 | Andrews et al. |
| 2004/0169466 | A1 | 9/2004 | Suehiro et al. |
| 2004/0196663 | A1 | 10/2004 | Ishida et al. |
| 2005/0073244 | A1 | 4/2005 | Chou et al. |
| 2005/0093005 | A1* | 5/2005 | Ruhnau .............. H01L 31/0203 257/79 |
| 2005/0152145 | A1 | 7/2005 | Currie et al. |
| 2005/0184387 | A1 | 8/2005 | Collins et al. |
| 2005/0199899 | A1 | 9/2005 | Lin et al. |
| 2005/0219835 | A1 | 10/2005 | Nagayama |
| 2005/0221519 | A1 | 10/2005 | Leung et al. |
| 2005/0264172 | A1 | 12/2005 | Wojnarowski et al. |

(56) References Cited

U.S. PATENT DOCUMENTS

| | | |
|---|---|---|
| 2006/0012299 A1 | 1/2006 | Suehiro et al. |
| 2006/0113906 A1 | 6/2006 | Ogawa |
| 2006/0139595 A1 | 6/2006 | Koenen et al. |
| 2006/0145172 A1 | 7/2006 | Su et al. |
| 2006/0147746 A1 | 7/2006 | Wakako et al. |
| 2006/0157722 A1 | 7/2006 | Takezawa et al. |
| 2006/0180818 A1 | 8/2006 | Nagai et al. |
| 2006/0186418 A1 | 8/2006 | Edmond |
| 2006/0220046 A1 | 10/2006 | Yu et al. |
| 2007/0018295 A1 | 1/2007 | Kim et al. |
| 2007/0029569 A1 | 2/2007 | Andrews |
| 2007/0057364 A1 | 3/2007 | Wang et al. |
| 2007/0131954 A1 | 6/2007 | Murayama et al. |
| 2007/0158668 A1 | 7/2007 | Tarsa |
| 2007/0161211 A1 | 7/2007 | Sunohara et al. |
| 2007/0194336 A1 | 8/2007 | Shin et al. |
| 2007/0228387 A1 | 10/2007 | Negley et al. |
| 2007/0241345 A1 | 10/2007 | Huang |
| 2007/0246730 A1 | 10/2007 | Oishi et al. |
| 2007/0247855 A1 | 10/2007 | Yano |
| 2007/0252523 A1 | 11/2007 | Maeda et al. |
| 2007/0253209 A1 | 11/2007 | Loh et al. |
| 2008/0012036 A1* | 1/2008 | Loh .................. H01L 33/483 257/99 |
| 2008/0019130 A1 | 1/2008 | Wang |
| 2008/0026498 A1 | 1/2008 | Tarsa et al. |
| 2008/0036362 A1 | 2/2008 | Tanimoto et al. |
| 2008/0054279 A1 | 3/2008 | Hussell et al. |
| 2008/0054284 A1 | 3/2008 | Hussell et al. |
| 2008/0054286 A1 | 3/2008 | Loh et al. |
| 2008/0078664 A1 | 4/2008 | Schmidt et al. |
| 2008/0079017 A1 | 4/2008 | Loh et al. |
| 2008/0089072 A1 | 4/2008 | Kim et al. |
| 2008/0106185 A1 | 5/2008 | Yamakawa |
| 2008/0106723 A1 | 5/2008 | Hoogendam et al. |
| 2008/0153344 A1 | 6/2008 | Horst et al. |
| 2008/0164484 A1 | 7/2008 | Lee |
| 2008/0173884 A1 | 7/2008 | Chitnis |
| 2008/0179611 A1 | 7/2008 | Chitnis |
| 2008/0191222 A1 | 8/2008 | Lee |
| 2008/0203417 A1* | 8/2008 | Konishi et al. ................ 257/98 |
| 2008/0219003 A1 | 9/2008 | Park |
| 2008/0224166 A1 | 9/2008 | Glovatsky et al. |
| 2008/0224608 A1 | 9/2008 | Konishi et al. |
| 2008/0239318 A1 | 10/2008 | Den Boef et al. |
| 2008/0258130 A1 | 10/2008 | Bergmann |
| 2009/0009103 A1 | 1/2009 | McKechnie et al. |
| 2009/0023323 A1 | 1/2009 | Lin et al. |
| 2009/0057690 A1 | 3/2009 | Chakraborty |
| 2009/0057699 A1 | 3/2009 | Basin et al. |
| 2009/0057901 A1* | 3/2009 | Lin et al. .................... 257/738 |
| 2009/0108281 A1 | 4/2009 | Keller et al. |
| 2009/0115313 A1 | 5/2009 | Lu et al. |
| 2009/0122514 A1 | 5/2009 | Yoon et al. |
| 2009/0130889 A1 | 5/2009 | Daily et al. |
| 2009/0140271 A1 | 6/2009 | Sah |
| 2009/0146176 A1 | 6/2009 | Oishi |
| 2009/0166657 A1 | 7/2009 | Yamada et al. |
| 2009/0218584 A1* | 9/2009 | Bogner .............. H01L 31/0203 257/98 |
| 2009/0239409 A1 | 9/2009 | Bishop |
| 2009/0261374 A1 | 10/2009 | Hayashi |
| 2009/0262527 A1 | 10/2009 | Chou |
| 2009/0289169 A1 | 11/2009 | Yang et al. |
| 2009/0315061 A1 | 12/2009 | Andrews |
| 2009/0315157 A1 | 12/2009 | Konishi et al. |
| 2009/0322197 A1* | 12/2009 | Helbing ................ H01L 33/507 313/46 |
| 2010/0022040 A1 | 1/2010 | Konishi |
| 2010/0078664 A1 | 4/2010 | Helbing |
| 2010/0096642 A1 | 4/2010 | Chang et al. |
| 2010/0103660 A1 | 4/2010 | Van de Ven et al. |
| 2010/0139836 A1 | 6/2010 | Horikoshi |
| 2010/0141182 A1 | 6/2010 | Shi |
| 2010/0155763 A1 | 6/2010 | Donofrio et al. |
| 2010/0187546 A1* | 7/2010 | Fushimi .................. H01L 33/62 257/88 |
| 2010/0193822 A1 | 8/2010 | Inobe et al. |
| 2010/0212942 A1 | 8/2010 | Tuan et al. |
| 2010/0237375 A1 | 9/2010 | Yamazaki et al. |
| 2010/0252851 A1 | 10/2010 | Emerson et al. |
| 2010/0253248 A1 | 10/2010 | Shi |
| 2010/0258830 A1 | 10/2010 | Ide et al. |
| 2010/0259706 A1 | 10/2010 | Kuwaharada |
| 2010/0264799 A1 | 10/2010 | Liu et al. |
| 2010/0270567 A1 | 10/2010 | Emerson et al. |
| 2010/0289055 A1* | 11/2010 | Tan ......................... H01L 21/56 257/100 |
| 2010/0301367 A1 | 12/2010 | Nakamura et al. |
| 2010/0320483 A1 | 12/2010 | Kadotani et al. |
| 2011/0001156 A1 | 1/2011 | Matsuda |
| 2011/0006334 A1 | 1/2011 | Ishii |
| 2011/0012143 A1 | 1/2011 | Yuan et al. |
| 2011/0013400 A1 | 1/2011 | Kanno et al. |
| 2011/0018017 A1* | 1/2011 | Bierhuizen ............ H01L 33/46 257/98 |
| 2011/0031524 A1 | 2/2011 | Pei |
| 2011/0043137 A1 | 2/2011 | Negley et al. |
| 2011/0062471 A1 | 3/2011 | Bierhuizen et al. |
| 2011/0065241 A1 | 3/2011 | Lin et al. |
| 2011/0068674 A1 | 3/2011 | Takenaka et al. |
| 2011/0068696 A1 | 3/2011 | Van de Ven et al. |
| 2011/0068702 A1 | 3/2011 | Van de Ven et al. |
| 2011/0079801 A1 | 4/2011 | Zhang et al. |
| 2011/0089465 A1* | 4/2011 | Lin et al. ........................ 257/99 |
| 2011/0116275 A1 | 5/2011 | Sheek |
| 2011/0121323 A1 | 5/2011 | Wu et al. |
| 2011/0127903 A1 | 6/2011 | Yao |
| 2011/0127912 A1 | 6/2011 | Lee et al. |
| 2011/0128730 A1 | 6/2011 | Chiu |
| 2011/0136394 A1 | 6/2011 | Mostoller et al. |
| 2011/0148327 A1 | 6/2011 | Van de Ven et al. |
| 2011/0176316 A1 | 7/2011 | Phipps et al. |
| 2011/0220929 A1 | 9/2011 | Collins et al. |
| 2011/0221330 A1 | 9/2011 | Negley et al. |
| 2011/0273079 A1* | 11/2011 | Pickard et al. ................ 313/483 |
| 2011/0291151 A1 | 12/2011 | Matsuda et al. |
| 2011/0309396 A1 | 12/2011 | Wang et al. |
| 2011/0316024 A1 | 12/2011 | Hung |
| 2012/0126255 A1 | 5/2012 | Hussell et al. |
| 2012/0126257 A1 | 5/2012 | Reiherzer et al. |
| 2012/0153340 A1 | 6/2012 | Song |
| 2012/0175643 A1 | 7/2012 | West |
| 2012/0193651 A1 | 8/2012 | Edmond |
| 2012/0205689 A1 | 8/2012 | Welch |
| 2012/0241807 A1 | 9/2012 | Hoetzl et al. |
| 2012/0250310 A1 | 10/2012 | Hussell et al. |
| 2012/0299022 A1 | 11/2012 | Hussell |
| 2012/0305949 A1 | 12/2012 | Donofrio et al. |
| 2012/0319150 A1 | 12/2012 | Shimomura |
| 2013/0058099 A1 | 3/2013 | Shum et al. |
| 2013/0087822 A1 | 4/2013 | Kim |
| 2013/0099265 A1 | 4/2013 | Hwang |
| 2013/0193468 A1 | 8/2013 | Hussell et al. |
| 2013/0207130 A1 | 8/2013 | Reiherzer |
| 2013/0207142 A1 | 8/2013 | Reiherzer |
| 2013/0256711 A1 | 10/2013 | Joo |
| 2013/0270592 A1 | 10/2013 | Reiherzer et al. |
| 2013/0279169 A1 | 10/2013 | Reiherzer |
| 2014/0097453 A1 | 4/2014 | Hussell et al. |
| 2014/0097454 A1 | 4/2014 | Hussell |
| 2014/0183577 A1 | 7/2014 | Hussell et al. |
| 2014/0217433 A1 | 8/2014 | Tudorica et al. |
| 2014/0240974 A1 | 8/2014 | Hussell et al. |
| 2014/0291715 A1 | 10/2014 | Reiherzer et al. |
| 2015/0207040 A1 | 7/2015 | Hussell |
| 2015/0280082 A1 | 10/2015 | Amo |
| 2016/0013164 A1 | 1/2016 | Tudorica et al. |
| 2017/0345866 A1 | 11/2017 | Joo et al. |

FOREIGN PATENT DOCUMENTS

| | | |
|---|---|---|
| CN | 101026206 A | 8/2007 |
| CN | 101056960 A | 10/2007 |

(56) References Cited

FOREIGN PATENT DOCUMENTS

| | | |
|---|---|---|
| CN | 101438630 A | 5/2009 |
| CN | 101614339 A | 12/2009 |
| CN | 101636887 | 1/2010 |
| CN | 101876406 | 11/2010 |
| CN | 101971378 A | 2/2011 |
| CN | 102044602 | 5/2011 |
| CN | 102280567 | 12/2011 |
| CN | ZL 2011-30139847.5 | 8/2012 |
| CN | ZL 2011-30166527.9 | 8/2012 |
| CN | ZL201230099913.5 | 11/2012 |
| CN | ZL201230099954.4 | 12/2012 |
| CN | ZL201230099981.1 | 12/2012 |
| CN | ZL 201230472866.4 | 5/2013 |
| CN | ZL201230130915.6 | 10/2013 |
| CN | ZL201230652790.3 | 10/2013 |
| CN | ZL201230652789.0 | 11/2013 |
| CN | ZL201230652840.8 | 11/2013 |
| CN | ZL201330361367.2 | 1/2014 |
| CN | ZL 201330359083.X | 5/2014 |
| CN | 104081112 B | 10/2014 |
| CN | 103270614 B | 5/2017 |
| CN | 104969368 B | 8/2017 |
| EP | 1640792 | 3/2006 |
| EP | 1 670 073 | 6/2006 |
| EP | 2 302 283 | 3/2011 |
| EP | 2 302 286 | 3/2011 |
| EP | 2327930 | 6/2011 |
| EP | 2 560 219 A1 | 2/2013 |
| EP | 2 643 861 | 10/2013 |
| EP | 2 643 862 | 10/2013 |
| EP | 2751471 | 7/2014 |
| FR | 2 921 537 | 9/2007 |
| JP | 07-038940 | 9/1995 |
| JP | H 10-247748 A | 9/1998 |
| JP | 10-311937 | 11/1998 |
| JP | 2000-022218 | 1/2000 |
| JP | 2000-353826 A | 12/2000 |
| JP | 2001-160630 | 6/2001 |
| JP | 2001-237462 | 8/2001 |
| JP | 2001-294083 | 10/2001 |
| JP | 2003-192442 | 7/2003 |
| JP | 2003-303504 | 10/2003 |
| JP | 2004-228413 | 8/2004 |
| JP | 2004-311948 A | 11/2004 |
| JP | 2005-183148 | 7/2005 |
| JP | 2005-266117 | 9/2005 |
| JP | 2005-276979 | 10/2005 |
| JP | 2006/066786 | 3/2006 |
| JP | 2006-093435 | 4/2006 |
| JP | 2006-294898 | 10/2006 |
| JP | 2007-189006 | 7/2007 |
| JP | 2007-227680 | 9/2007 |
| JP | 2007-266357 | 10/2007 |
| JP | 2007-323857 | 12/2007 |
| JP | 2007-335371 | 12/2007 |
| JP | 2008-244075 | 10/2008 |
| JP | 2009-503888 | 1/2009 |
| JP | 2009-044055 | 2/2009 |
| JP | 2009-146935 | 7/2009 |
| JP | 2009-289918 | 12/2009 |
| JP | 2010-009972 | 1/2010 |
| JP | 2010103541 | 5/2010 |
| JP | 2010-147189 | 7/2010 |
| JP | 2010192109 A | 9/2010 |
| JP | 2011-108744 | 6/2011 |
| JP | 2011-228369 | 11/2011 |
| JP | 2012-503331 | 2/2012 |
| JP | 2012-079855 | 4/2012 |
| JP | 1461828 | 2/2013 |
| JP | 1476166 | 7/2013 |
| JP | 1476175 | 7/2013 |
| JP | 1493219 | 2/2014 |
| JP | 6106859 B | 3/2017 |
| KR | 3003783820000 | 4/2005 |
| KR | 3004423910000 | 3/2007 |
| KR | 10-0793338 | 1/2008 |
| KR | 10-2008-0033496 | 4/2008 |
| KR | 10-0829910 | 5/2008 |
| KR | 10-2008-0092239 | 10/2008 |
| KR | 10-2009-0011121 | 2/2009 |
| KR | 10-0933920 | 12/2009 |
| KR | 10-2010-0008509 | 1/2010 |
| KR | 10-2010-0111255 | 10/2010 |
| KR | 10-2011-0004632 | 1/2011 |
| KR | 10-2011-0021639 | 3/2011 |
| KR | 10-2011-0111941 | 10/2011 |
| KR | DES 30-0753131 | 7/2014 |
| KR | DES 30-0753132 | 7/2014 |
| TW | 540169 | 7/2003 |
| TW | 113260 | 10/2006 |
| TW | 124444 | 8/2008 |
| TW | D125589 | 10/2008 |
| TW | 128526 | 5/2009 |
| TW | 201029146 | 8/2010 |
| TW | D140389 | 5/2011 |
| TW | D141645 | 7/2011 |
| TW | D144159 | 12/2011 |
| TW | D145644 | 3/2012 |
| TW | D156539 | 10/2013 |
| TW | D159325 | 3/2014 |
| TW | D159326 | 3/2014 |
| TW | D159849 | 4/2014 |
| TW | D159850 | 4/2014 |
| TW | D159851 | 4/2014 |
| TW | D160508 | 5/2014 |
| TW | D160509 | 5/2014 |
| TW | D160580 | 5/2014 |
| TW | D160581 | 5/2014 |
| TW | D160850 | 6/2014 |
| TW | D162119 | 8/2014 |
| TW | I481072 | 4/2015 |
| TW | I502772 | 10/2015 |
| WO | WO 2008/041813 A1 | 4/2008 |
| WO | WO 2008/069204 | 6/2008 |
| WO | WO 2009/133615 | 11/2009 |
| WO | WO 2009/141982 | 11/2009 |
| WO | WO 2011/129203 | 10/2011 |
| WO | WO 2012/029360 | 3/2012 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |
| WO | WO 2013/070696 | 5/2013 |
| WO | WO 2013/096431 | 6/2013 |
| WO | WO 2013/122831 | 8/2013 |
| WO | WO 2013/148823 | 10/2013 |
| WO | WO 2013/148826 | 10/2013 |
| WO | WO 2014/120256 | 8/2014 |

OTHER PUBLICATIONS

Chinese Correction of Deficiencies for Application No. 201330359083.X dated Nov. 5, 2013.
Taiwanese Office Action and Search Report for Application No. 102302923 dated Dec. 30, 2013.
Chinese Notice of Grant for Application No. 201330359083.X dated Jan. 26, 2014.
Taiwanese Notice of Allowance for Application No. 102302923 dated Apr. 7, 2014.
International Search Report and Written Opinion for Application No. PCT/US2013/034084 dated Jul. 25, 2013.
International Search Report and Written Opinion for Application No. PCT/US2013/034087 dated Jul. 25, 2013.
U.S. Appl. No. 13/607,217 dated Sep. 7, 2012.
Restriction Requirement for U.S. Appl. No. 13/755,993 dated Jul. 10, 2014.
Restriction Requirement for U.S. Appl. No. 13/834,195 dated Jul. 21, 2014.
Bridgelux Product Data Sheet—1 page.
Citizen Co. Product Data Sheet—4 pages http://ce.citizen.co.jp/lighting_led/en/products/index.html.

(56) References Cited

OTHER PUBLICATIONS

U.S. Appl. No. 29/379,636 for "Light Emitting Device Package" filed Nov. 22, 2010.
Design U.S. Appl. No. 29/380,387 for "Light Emitting Device Package" filed Dec. 3, 2010.
U.S. Appl. No. 13/028,972 for "Light Emitting Devices and Methods" filed Feb. 16, 2011.
U.S. Appl. No. 13/104,558 for "Light Emitting Devices and Methods" filed May 10, 2011.
Notice of Allowance for U.S. Appl. No. 29/379,636 dated Aug. 4, 2011.
Design U.S. Appl. No. 29/404,913 for "Light Emitting Device Component" filed Oct. 26, 2011.
U.S. Appl. No. 13/224,850 for "Light Emitting Device Component" filed Sep. 2, 2011.
U.S. Appl. No. 29/379,636 for "Light Emitting Device Package" filed Nov. 22, 2011.
U.S. Appl. No. 29/408,955 for "Light Emitting Device Package" filed Dec. 19, 2011.
U.S. Appl. No. 13/336,540 dated Dec. 23, 2011.
Notification of Granting Patent Right for Design for Application Serial No. CN 2011/30166527.9 dated Apr. 6, 2012.
Non-Final Office Action for U.S. Appl. No. 29/380,387 dated Apr. 25, 2012.
Notification of Granting Patent Right for Design for Application Serial No. CN 2011/30139847.5 dated Apr. 26, 2012.
Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
International Search Report and Written Opinion for Application Serial No. PCT/US2011/058596 dated Jun. 18, 2012.
Chinese Office Action for Application Serial No. CN 2012/30130915.6 dated Jul. 12, 2012.
Office Action/Restriction Requirement for U.S. Appl. No. 13/028,972 dated Jul. 25, 2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 17, 2012.
Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Non-Final Office Action for U.S. Appl. No. 13/028,972 dated Oct. 10, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for U.S. Appl. No. 13/104,558 dated Jan. 3, 2013.
Taiwanese Search Report for Application No. 101302309 dated Jan. 14, 2013.
Taiwanese Office Action for Application No. 101302309 dated Jan. 23, 2013.
Chinese Decision to Grant for Application No. 201230472866.4 dated Jan. 24, 2013.
Notice of Allowance for U.S. Appl. No. 13/336,540 dated Jan. 31, 2013.
Restriction Requirement for U.S. Appl. No. 13/671,089 dated Feb. 7, 2013.
Restriction Requirement for U.S. Appl. No. 29/404,913 dated Feb. 15, 2013.
Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
Notice of Allowance for U.S. Appl. No. 13/028,972 dated Feb. 28, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Non-Final Office Action for U.S. Appl. No. 13/671,089 dated Mar. 29, 2013.
Taiwanese Search Report for Application No. 102300059 dated Apr. 17, 2013.
International Search Report and Written Opinion for Application No. PCT/US2012/070589 dated Apr. 22, 2013.
Taiwanese Search Report for Application No. 102300058 dated Apr. 29, 2013.
International Search Report and Written Opinion for Application No. PCT/US2013/025307 dated May 15, 2013.
Notice of Allowance for U.S. Appl. No. 13/028,972 dated May 23, 2013.
Japanese Office Action for Application No. 2012-031549 dated Jun. 4, 2013.
Japanese Decision of Registration for Application No. 2012-023963 dated Jun. 4, 2013.
Japanese Decision of Registration for Application No. 2012-026117 dated Jun. 4, 2013.
Taiwanese Notice of Allowance for Application No. 101302309 dated Jun. 5, 2013.
Notice of Allowance for U.S. Appl. No. 13/435,912 dated Jun. 19, 2013.
Notice of Allowance for U.S. Appl. No. 29/404,913 dated Jun. 25, 2013.
Chinese Notice of Grant for Application No. 201230652790.3 dated Jun. 26, 2013.
Notice of Allowance for U.S. Appl. No. 13/104,558 dated Jul. 1, 2013.
Chinese Notice of Grant for Application No. 201230130915.6 dated Jul. 3, 2013.
Taiwanese Search Report for Application No. 102301394 dated Jul. 9, 2013.
Taiwanese Search Report for Application No. 102301395 dated Jul. 9, 2013.
Taiwanese Office Action for Application No. 102301394 dated Jul. 15, 2013.
Taiwanese Office Action for Application No. 102301395 dated Jul. 15, 2013.
Chinese Decision to Grant for Application No. 201230652789 dated Jul. 17, 2013.
Chinese Notice of Grant for Application No. 201230652840.3 dated Jul. 26, 2013.
Ex Parte Quayle Action for U.S. Appl. No. 13/671,089 dated Aug. 13, 2013.
Korean Office Action for Application No. 30-2012-0020196 dated Aug. 13, 2013.
Korean Office Action for Application No. 30-2012-0020197 dated Aug. 13, 2013.
Korean Office Action for Application No. 30-2012-0020198 dated Aug. 13, 2013.
Taiwanese Office Action for Application No. 102300058 dated Aug. 27, 2013.
Notice of Allowance for U.S. Appl. No. 13/104,558 dated Aug. 28, 2013.
Non-Final Office Action for U.S. Appl. No. 13/224,850 dated Sep. 5, 2013.
Taiwanese Office Action for Application No. 102301581 dated Sep. 6, 2013.

(56) References Cited

OTHER PUBLICATIONS

Taiwanese Office Action for Application No. 102301582 dated Sep. 6, 2013.
Taiwanese Office Action for Application No. 102301583 dated Sep. 6, 2013.
Taiwanese Office Action for Application No. 102301584 dated Sep. 6, 2013.
Taiwanese Office Action for Application No. 102301585 dated Sep. 6, 2013.
Restriction Requirement for U.S. Appl. No. 13/793,882 dated Sep. 20, 2013.
Restriction Requirement for U.S. Appl. No. 29/417,220 dated Sep. 27, 2013.
Restriction Requirement for U.S. Appl. No. 29/451,177 dated Sep. 27, 2013.
Restriction Requirement for U.S. Appl. No. 29/425,831 dated Sep. 30, 2013.
Taiwanese Office Action for Application No. 102300059 dated Oct. 1, 2013.
Chinese Notice to Grant for Application No. 201330361367.2 dated Oct. 8, 2013.
Notice of Allowance for U.S. Appl. No. 13/671,089 dated Oct. 22, 2013.
Restriction Requirement for U.S. Appl. No. 29/412,166 dated Oct. 25, 2013.
Restriction Requirement for U.S. Appl. No. 29/412,168 dated Oct. 25, 2013.
Japanese Office Action for Application No. 2012-031548 dated Nov. 5, 2013.
Japanese Office Action for Application No. 2012-031549 dated Nov. 5, 2013.
Taiwanese Notice of Allowance for Application No. 102301394 dated Nov. 8, 2013.
Taiwanese Notice of Allowance for Application No. 102301395 dated Nov. 8, 2013.
Non-Final Office Action for U.S. Appl. No. 13/793,882 dated Nov. 15, 2013.
Restriction Requirement for U.S. Appl. No. 13/282,172 dated Nov. 26, 2013.
Notice of Allowance for U.S. Appl. No. 29/404,913 dated Nov. 27, 2013.
Taiwanese Notice of Allowance for Application No. 102301583 dated Dec. 17, 2013.
Taiwanese Notice of Allowance for Application No. 102301581 dated Dec. 17, 2013.
Taiwanese Notice of Allowance for Application No. 102301585 dated Dec. 17, 2013.
Notice of Allowance for U.S. Appl. No. 29/412,168 dated Dec. 20, 2013.
Non-Final Office Action for U.S. Appl. No. 29/425,831 dated Dec. 24, 2013.
Notice of Allowance for U.S. Appl. No. 29/412,166 dated Dec. 24, 2013.
Non-Final Office Action for U.S. Appl. No. 29/451,177 dated Dec. 30, 2013.
Notice of Allowance for U.S. Appl. No. 29/417,220 dated Jan. 10, 2014.
Taiwanese Notice of Allowance for Application No. 102301582 dated Jan. 13, 2014.
Taiwanese Notice of Allowance for Application No. 102301584 dated Jan. 13, 2014.
Japanese Decision of Registration for Application No. 2013-018279 dated Jan. 15, 2014.
Taiwanese Notice of Allowance for Application No. 102300058 dated Jan. 17, 2014.
Taiwanese Notice of Allowance for Application No. 102300059 dated Jan. 17, 2014.
Korean Notice of Rejection for Application No. KR 30-2012-0020198 dated Jan. 14, 2014.
Taiwanese Notice of Allowance for Application No. 101307667 dated Feb. 7, 2014.
Supplemental Notice of Allowance for U.S. Appl. No. 29/404,913 dated Feb. 20, 2014.
Notice of Allowance for U.S. Appl. No. 13/793,882 dated Mar. 12, 2014.
Restriction Requirement for U.S. Appl. No. 14/043,494 dated Mar. 20, 2014.
Restriction Requirement for U.S. Appl. No. 13/908,597 dated Mar. 20, 2014.
Restriction Requirement for U.S. Appl. No. 14/052,201 dated Mar. 20, 2014.
Non-Final Office Action for U.S. Appl. No. 13/282,172 dated Mar. 21, 2014.
U.S. Appl. No. 11/656,759 dated Jan. 22, 2007.
U.S. Appl. No. 11/899,790 dated Sep. 7, 2007.
U.S. Appl. No. 12/014,404 dated Jan. 15, 2008.
U.S. Appl. No. 12/717,048 dated Mar. 3, 2010.
U.S. Appl. No. 11/473,089 dated Jun. 21, 2006.
Taiwanese Office Action for Application No. 100141888 dated Mar. 11, 2014.
Notice of Allowance for U.S. Appl. No. 29/451,177 dated Apr. 25, 2014.
Restriction Requirement for U.S. Appl. No. 14/148,102 dated Apr. 24, 2014.
Notice of Publication for U.S. Appl. No. 14/043,494 dated Apr. 10, 2014.
Notice of Publication for U.S. Appl. No. 14/052,201 dated Apr. 10, 2014.
Korean Notice of Allowance for Application No. 30-2012-0020196 dated Apr. 21, 2014.
Korean Notice of Allowance for Application No. 30-2012-0020197 dated Apr. 21, 2014.
Final Office Action for U.S. Appl. No. 13/224,850 dated May 30, 2014.
Online definition of the term "non-linear", http://thefreedictionary.com/nonlinear, accessed on May 17, 2014.
Final Office Action for U.S. Appl. No. 29/425,831 dated Jun. 10, 2014.
Korean Office Action for Application No. 10-2013-7015669 dated Jun. 3, 2014.
European Notice of Publication for Application No. 12827778.7 dated Jun. 12, 2014.
Restriction Requirement for U.S. Appl. No. 13/836,709 dated Jun. 19, 2014.
Non-Final Office Action for U.S. Appl. No. 14/052,201 dated Jun. 19, 2014.
Non-Final Office Action for U.S. Appl. No. 14/043,494 dated Jun. 20, 2014.
Non-Final Office Action for U.S. Appl. No. 14/148,102 dated Jun. 20, 2014.
Restriction Requirement for U.S. Appl. No. 14/168,561 dated Jul. 1, 2014.
Non-Final Office Action for U.S. Appl. No. 14/189,500 dated Jul. 15, 2014.
Korean Trial Decision for Application No. 30-2012-0020198 dated Jul. 29, 2014.
Taiwanese Office Action for Application No. 100141889 dated Aug. 6, 2014.
Notice of Allowance for U.S. Appl. No. 13/908,597 dated Aug. 20, 2014.
European Patent Office Communication pursuant to Rule 114(2) EPC for Application No. 2011-0843773 dated Aug. 20, 2014.
Japanese Office Action for Application No. 2012031548 dated Sep. 1, 2014.
Japanese Office Action for Application No. 2012031549 dated Sep. 1, 2014.
Notice of Allowance for U.S. Appl. No. 29/425,831 dated Sep. 4, 2014.
Final Office Action for U.S. Appl. No. 13/282,172 dated Sep. 17, 2014.
Non-Final Office Action for U.S. Appl. No. 13/755,993 dated Nov. 5, 2014.

(56) References Cited

OTHER PUBLICATIONS

Non-Final Office Action for U.S. Appl. No. 13/834,195 dated Nov. 19, 2014.
Restriction Requirement for U.S. Appl. No. 29/444,591 dated Jan. 30, 2015.
Non-Final Office Action for U.S. Appl. No. 13/800,260 dated Feb. 5, 2015.
Machine translation of JP 200-022218 A published Jan. 21, 2000 Tadaaki.
Machine translation of KR 10-2009-0049979 published Dec. 28, 2009 Kim et al.
Final Office Action for U.S. Appl. No. 13/834,195 dated Mar. 6, 2015.
Final Office Action for U.S. Appl. No. 13/755,993 dated Mar. 6, 2015.
Restriction Requirement for U.S. Appl. No. 29/444,591 dated Mar. 30, 2015.
Chinese Office Action for Application No. 201180065495.0 dated May 29, 2015.
Notice of Allowance for U.S. Appl. No. 14/043,494 dated Jul. 30, 2015.
Notice of Allowance for U.S. Appl. No. 14/148,102 dated Jul. 31, 2015.
Chinese Office Action for Application No. 201180065708.X dated Jun. 23, 2015.
Supplemental Notice of Allowance for U.S. Appl. No. 29/459,233 dated Aug. 13, 2015.
Korean Certificate of Design Patent for Application No. 2012-0020196 dated Jul. 14, 2014.
Korean Certificate of Design Patent for Application No. 2012-0020197 dated Jul. 14, 2014.
European Patent Office Communication pursuant to Rule 114(2) EPC for Application No. 20110843026 dated Sep. 24, 2014.
Taiwanese Office Action for Application No. 100141887 dated Sep. 11, 2014.
Korean Decision of Rejection for Application No. 10-2013-7015669 dated Nov. 6, 2014.
Non-Final Office Action for U.S. Appl. No. 14/148,102 dated Dec. 5, 2014.
Taiwanese Notice of Allowance for Application No. 100141889 dated Dec. 8, 2014.
Notice of Allowance for U.S. Appl. No. 14/043,494 dated Dec. 10, 2014.
Notice of Allowance for U.S. Appl. No. 14/052,201 dated Nov. 28, 2014.
Notice of Allowance for U.S. Appl. No. 14/168,561 dated Nov. 28, 2014.
Restriction Requirement for U.S. Appl. No. 29/452,692 dated Dec. 4, 2014.
Non-Final Office Action for U.S. Appl. No. 13/224,850 dated Dec. 18, 2014.
Japanese Office Action for Application No. 2013-540955 dated Jan. 20, 2015.
Notice of Allowance for U.S. Appl. No. 14/189,500 dated Jan. 23, 2015.
Korean Decision to Decline Amendment and Decision of Rejection for Application No. 10-2013-7015669 dated Dec. 26, 2014.
Restriction Requirement for U.S. Appl. No. 29/459,233 dated Feb. 23, 2015.
Restriction Requirement for U.S. Appl. No. 29/459,231 dated Feb. 13, 2015.
Notice of Allowance for U.S. Appl. No. 29/487,954 dated Mar. 30, 2015.
Notice of Allowance for U.S. Appl. No. 14/043,494 dated Apr. 17, 2015.
European Search Report for Application No. 11 84 3026 dated Apr. 17, 2015.
Notice of Allowance for U.S. Appl. No. 14/148,102 dated Apr. 22, 2015.
Supplementary European Search Report for Application No. 11 84 3026 dated Apr. 28, 2015.
Non-Final Office Action for U.S. Appl. No. 13/282,172 dated May 11, 2015.
Notice of Allowance for U.S. Appl. No. 29/459,231 dated May 11, 2015.
Notice of Allowance for U.S. Appl. No. 14/189,500 dated May 14, 2015.
Notice of Allowance for U.S. Appl. No. 29/459,233 dated May 21, 2015.
Japanese Office Action for Application No. 2014-548830 dated May 19, 2015.
Supplemental Notice of Allowability for U.S. Appl. No. 14/043,494 dated May 28, 2015.
Japanese Office Action for Application No. 2012-031549 dated May 25, 2015.
Taiwanese Notice of Allowance for Application No. 100141887 dated May 28, 2015.
Extended European Search Report for Application No. 12849022.4 dated Jun. 16, 2015.
Supplementary European Search Report for Application No. 12827778.7 dated Jun. 11, 2015.
Appeal Decision for Japanese Design Application No. 2012-031548 dated Jun. 17, 2015.
Non-Final Office Action for U.S. Appl. No. 14/673,263 dated Jun. 30, 2015.
Final Office Action for U.S. Appl. No. 13/296,812 dated Apr. 23, 2015.
Japanese Office Action for Application No. 2013/540955 dated Jul. 7, 2015.
Chinese Office Action for Application No. 201280066174.7 dated Jun. 3, 2015.
Notice of Allowance for U.S. Appl. No. 14/189,500 dated Jul. 17, 2015.
Final Office Action for U.S. Appl. No. 13/224,850 dated Jul. 22, 2015.
Chinese Office Action for Application No. 201180061776.9 dated Jun. 10, 2015.
Taiwanese Office Action for Application No. 101149281 dated Jun. 12, 2015.
Japanese Appeal Decision for Application No. 2014-24357 dated Feb. 25, 2016.
Chinese Office Action for Application No. 201180061776.9 dated Feb. 22, 2016.
Korean Office Action for Application No. 10-2014-7014959 dated Nov. 9, 2015.
Japanese Office Action for Application No. dated Nov. 10, 2015.
Advisory Action for U.S. Appl. No. 13/800,260 dated Oct. 14, 2015.
Non-Final Office Action for U.S. Appl. No. 13/755,993 dated Nov. 27, 2015.
Non-Final Office Action for U.S. Appl. No. 13/834,195 dated Feb. 26, 2016.
Final Office Action for U.S. Appl. No. 13/755,993 dated Apr. 8, 2016.
Non-Final Office Action for U.S. Appl. No. 13/800,260 dated Jun. 15, 2016.
Advisory Action for U.S. Appl. No. 13/755,993 dated Jun. 16, 2016.
Final Office Action for U.S. Appl. No. 13/834,195 dated Jun. 23, 2016.
Chinese Office Action for Application No. 2013800181871 dated Apr. 25, 2016.
Chinese Office Action for Application No. 201380018673 dated Jun. 21, 2016.
Non-Final Office Action for U.S. Appl. No. 13/755,993 dated Sep. 22, 2016.
Notice of Allowance for U.S. Appl. No. 13/834,195 dated Apr. 11, 2017.
Chinese Office Action for Chinese Application No. 201380071952 dated Nov. 2, 2016.
Chinese Office Action for Application No. 201180065495 dated Nov. 4, 2016.
Non-Final Office Action for U.S. Appl. No. 13/834,195 dated Nov. 28, 2016.

(56) References Cited

OTHER PUBLICATIONS

Non-Final Office Action for U.S. Appl. No. 13/800,260 dated Jan. 3, 2017.
Japanese Decision of Grant for Japanese Patent Application No. 2013-540955 dated Jan. 10, 2017.
Chinese Office Action for Application No. 201180065495 dated Feb. 22, 2017.
Final Office Action for U.S. Appl. No. 13/755,993 dated Mar. 13, 2017.
Chinese Notice of Grant for Chinese Application No. 201180061776 dated Feb. 15, 2017.
Chinese Office Action for Application No. 2013800181871 dated Apr. 20, 2017.
Interview Summary for U.S. Appl. No. 13/755,993 dated Apr. 25, 2017.
Notice of Allowance and After Final Consideration Program Decision for U.S. Appl. No. 13/755,993 dated Jun. 1, 2017.
Notice of Issuance for Chinese Application No. 201380071952.6 dated Jun. 2, 2017.
Corrected Notice of Allowance for U.S. Appl. No. 13/755,993 dated Jun. 20, 2017.
Non-Final Office Action for U.S. Appl. No. 13/800,260 dated Jul. 17, 2017.
Chinese Reexamination Decision for Chinese Application No. 201380018187.1 dated Jan. 3, 2018.
Fourth Office Action for Chinese Application No. 2013800181871 dated Jan. 19, 2018.
Chinese Decision of Rejection for Application No. 2013800181871 dated Aug. 9, 2017.
Non-Final Office Action for U.S. Appl. No. 13/800,260 dated Mar. 29, 2018.
Notice of Allowance for U.S. Appl. No. 13/800,260 dated Dec. 5, 2017.
Chinese Office Action for Application No. 2013800181871 dated Oct. 17, 2016.

\* cited by examiner

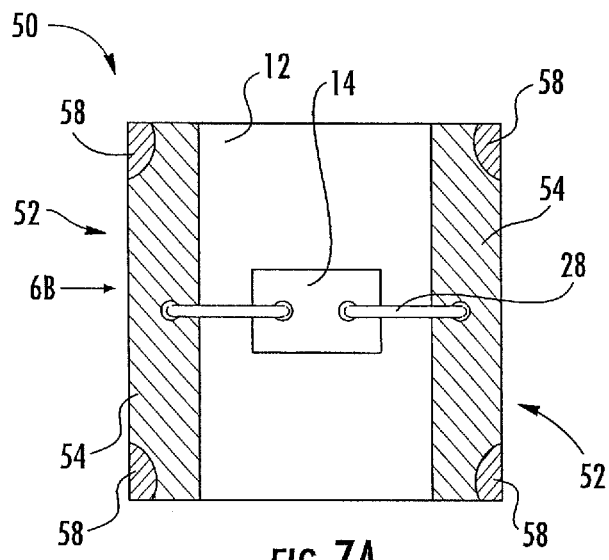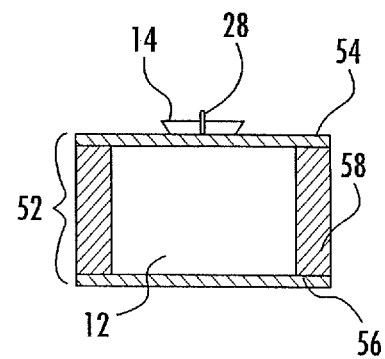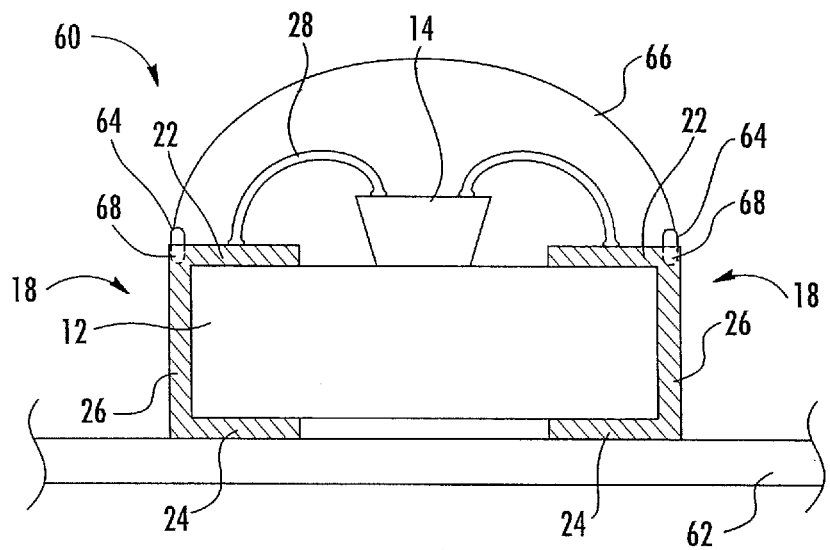

SUBMOUNT BASED SURFACE MOUNT DEVICE (SMD) LIGHT EMITTER COMPONENTS AND METHODS

CROSS REFERENCE TO RELATED APPLICATIONS

This application relates and claims priority to U.S. Provisional Patent Application Ser. Nos. 61/618,327, filed Mar. 30, 2012, and 61/642,995, filed May 4, 2012. This application also relates to U.S. patent application for LIGHT EMITTER COMPONENTS AND METHODS HAVING IMPROVED ELECTRICAL CONTACTS, filed Mar. 13, 2013. The entire contents of each of these references are hereby incorporated by reference herein.

TECHNICAL FIELD

The subject matter disclosed herein relates generally to surface mount device (SMD) components and methods. More particularly, the subject matter disclosed herein relates to submount based SMD light emitter components and methods.

BACKGROUND

Light emitting diodes (LEDs) or LED chips are solid state devices that convert electrical energy into light. LED chips can be utilized in light emitter components or packages for providing different colors and patterns of light useful in various lighting and optoelectronic applications. Light emitter components can include surface mount devices (SMDs) which can be mounted directly onto the surface of an underlying circuit component or heat sink, such as a printed circuit board (PCB) or metal core printed circuit board (MCPCB). SMDs can comprise bottom electrical contacts or leads configured to directly mount to the underlying circuit component. SMDs can be used in various LED light bulb and light fixture applications, and are developing as replacements for incandescent, fluorescent, and metal halide high-intensity discharge (HID) lighting applications.

Conventional SMD light emitter components can utilize one or more LED chips mounted within a component body and surrounded by a reflector cavity. The component body and integrally formed reflector cavity are molded from the same material, and portions of the body are typically molded about electrical contacts or leads. Individually molding component bodies can be both expensive and time-consuming. Moreover, changing the component or package design, such as changing the size, shape, and/or angle of the reflector cavity requires that new molds be designed and implemented.

Thus, despite the availability of various SMD light emitter components in the marketplace, a need remains for components and methods which can be produced quickly and efficiently and based off of a submount. In one aspect, submount based SMD components can allow for customized reflector cavities having differently sized, shaped, or angled reflector cavities.

SUMMARY

In accordance with this disclosure, substrate based surface mount device (SMD) light emitter components and methods having improved manufacturability and customization are provided and described herein. Components and methods described herein can advantageously exhibit improved processing times, ease of manufacture, and/or lower processing costs. Components described herein can be well suited for a variety of applications such as personal, industrial, and commercial lighting applications including, for example, light bulbs and light fixture products and/or applications. It is, therefore, an object of the present disclosure to provide SMD light emitter components and methods that are submount based, in one aspect, by allowing a multitude of different components, packages, and/or form factors to be created over individual submounts, without incurring the expense of custom fabricated ceramic packages.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 7A and 7B are top and side views, respectively, of a further embodiment of a submount based light emitter component according to the disclosure herein;

FIGS. 8A to 8D are cross-sectional views of further embodiments of submount based light emitter components according to the disclosure herein.

DETAILED DESCRIPTION

Figure 1:
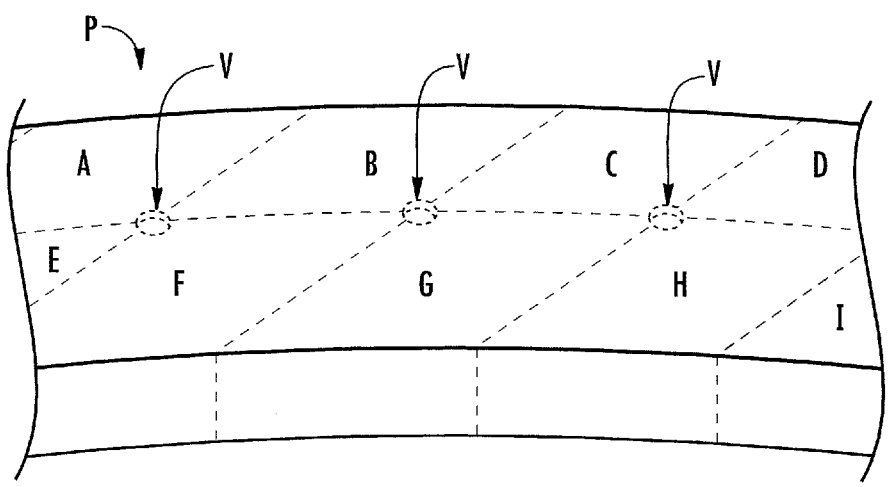
FIG. 1 is a perspective view of a panel of submounts as used in light emitter components according to the disclosure herein.

The subject matter disclosed herein is directed to submount based surface mount design (SMD) light emitter components and methods, such as submount based light emitting diode (LED) components and methods. Components and methods provided herein can exhibit improved manufacturability and can provide customized component bodies, including reflection cavities disposed about LED chips without incurring the expense associated with custom fabricated ceramic or molded packages. Notably, individual submounts can be singulated from a large panel of material, for example, a large ceramic substrate, and can allow a multitude of different components to be formed thereon. Components described herein can comprise non-metallic submount material(s) that is/are substantially transparent and substantially non-absorbing of light emitted by one or more LED chips. Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would now be oriented "below" the other structures or portions. Likewise, if components in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, the terms "through-hole", "thru-hole", and/or "via" are synonymous and refer a small opening in the submount, often filled with an electrically conductive material that allows a conductive connection between different layers or features of the component. The term "exposing" a thru-hole or via refers to sawing, cutting, dicing, etching, uncovering, displacing, or otherwise causing the metal disposed inside the via to be disposed on an external surface of the submount. Thus, the conductive material will be "exposed" outside of and/or along an exterior, outer surface of the component, or component submount.

As used herein, the terms "electrical contacts", "leads", and/or "leadframes" are synonymous and refer to conductive members or elements which can pass electrical current into an LED chip, for example, by wirebonding, through die attachment, or other methods known in the art.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa1-xN$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. The phosphors can absorb a portion of light from the LED chip and emit a different wavelength of light such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the yellow wavelength spectrum. The components can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter components and methods according to the present subject matter can also have multiple LED chips of different colors, one or more of which can be white emitting.

FIGS. 1 through 11 illustrate embodiments of submount based SMD light emitter components and methods according to the present subject matter as disclosed and described herein. FIG. 1 is a substrate or panel, generally designated P, from which one or more individual submounts (denoted A-I) can be singulated, separated, or physically isolated. In one aspect, panel P can comprise a non-metallic material, such as a high reflectivity ceramic based material for maximizing light extraction and reflectance. For example, panel P can comprise a substrate of aluminum oxide (e.g., alumina or $Al_2O_3$) or a substrate containing $Al_2O_3$. The broken lines along panel P indicate lines along which the panel may be sawn, cut, etched, or otherwise physically separated, for providing or forming individual submounts A-I. Individual submounts A-I can comprise at least one substantially flat upper surface over which one or more LED chips (14, FIG. 2) can be mounted.

Individual submounts A-I can comprise any size, shape, and/or cross-sectional shape. For illustration purposes, individual submounts A-I having a substantially square or rectangular cross-sectional shape are shown, however, any other non-rectangular shape is contemplated herein. Notably, individual submounts A-I can comprise the building block of customized SMD type emitter components or packages described herein. For example, in one aspect, customized reflector cavities of a different material than the submount (e.g., non-ceramic reflector cavities) can be provided over and/or around portions of the individual submounts A-I. Thus, a multitude of different customized components can be provided without the expense of creating custom fabricated ceramic components and/or custom molded plastic components.

Panel P can optionally comprise one or more openings or thru-holes or vias V as indicated in broken lines. An electrically conductive material, such as a metal or metal alloy, can be provided inside vias V for creating electrically conductive vias. In one aspect, vias V can be filled with silver (Ag), copper (Cu), and/or Ag or Cu alloys for electrically connecting a top electrical contact with a bottom electrical contact of an SMD type component. In other aspects, conductive material disposed within vias V can be exposed to form novel side contact portions (see, e.g., 48, 58, FIGS. 6A to 7B) for externally electrically connecting top and bottom portions of an electrical contact used in SMD type components.

Figure 2:
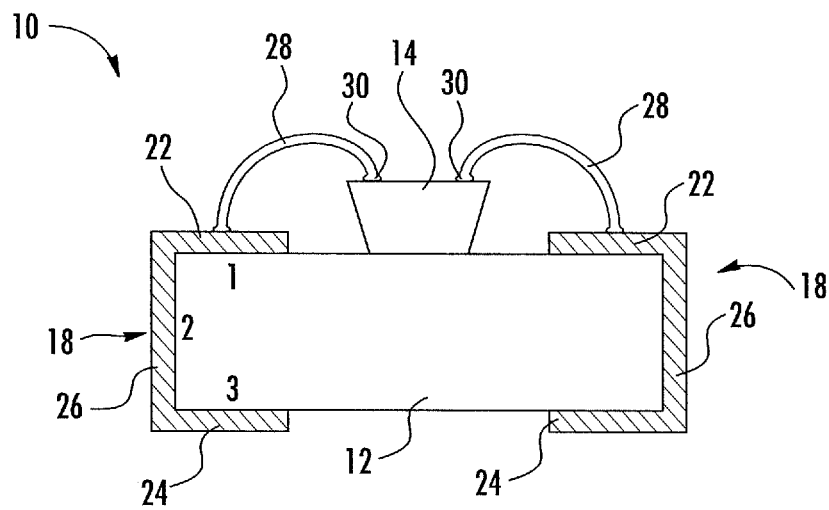
FIGS. 2 and 3 are cross-sectional views of a submount based light emitter component according to the disclosure herein.
Figure 3:
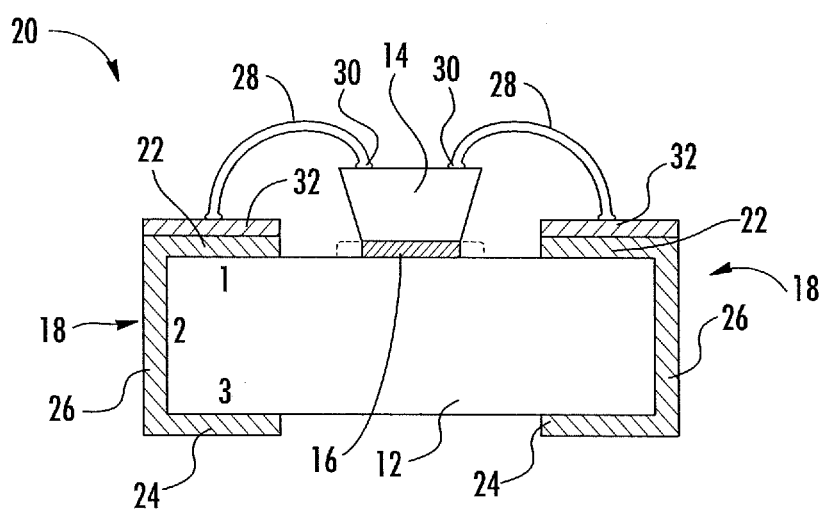

FIGS. 2 and 3 are cross-sectional views of submount based light emitter components, generally designated 10 and 20, respectively. Light emitter components 10 and 20 can comprise substrate or submount based packages for surface mount device (SMD) applications. SMD type components can comprise electrical contacts, typically along the bottom of the device, for directly connecting to and/or electrically and thermally connecting with external heat sinks or circuit components such as a PCB or a MCPCB. Light emitter components 10 and 20 can comprise a non-metallic based submount 12, similar to individual submounts A-I described in FIG. 1, which can comprise non-metallic material. In one aspect, submount 12 can comprise a ceramic based material, such as a high reflectivity ceramic material for maximizing light extraction and reflectance. At least one light emitter chip, such as an LED chip 14, can be provided and disposed over submount 12. The at least one LED chip 14 can be configured to activate a yellow, red, and/or green phosphor (not shown) disposed either directly over LED chip 14 and/or directly over a portion of emitter component 10 for producing cool and/or warm white output.

In some aspects, LED chip 14 can directly attach and/or mount to submount 12 via an adhesive or epoxy material (not shown). In other aspects, an optional layer of material (e.g., 16, FIG. 3) can be disposed between submount 12 and LED chip 14. Notably, as discussed further below, light emitter components 10 and 20 can comprise at least one electrical contact, generally designated 18, disposed along one or more portions of one or more external surfaces of submount 12 and spaced apart from LED chip 14. For example and in one aspect, electrical contact 18 can extend over and cover portions of at least three external surfaces of the submount. The at least one electrical contact 18 can electrically connect to the at least one LED chip 14 for providing electrical current to LED chip 14. Notably, submounts 12 combined with novel electrical contacts 18 disclosed herein can provide a plurality of customized components which can be assembled quickly, easily, and inexpensively when customized reflector cavities are provided over each submount 12.

In some aspects, submount 12 can comprise a portion of material that has been singulated from a large, non-metallic panel (i.e., P, FIG. 1) however, individually formed and/or pressed submounts are also contemplated herein. Generally, it is desirable to provide a substrate or submount 12 that is highly reflective to visible light (e.g., greater than about 90%), and which can provide conduction of heat as well as mechanical support. In one aspect, non-metallic and/or ceramic materials containing $Al_2O_3$ exhibit such desirable qualities. Accordingly, submount 12 can comprise a ceramic based body of material such as $Al_2O_3$ and/or containing $Al_2O_3$.

In some aspects, submount 12 can comprise a ceramic body that can be cast from low temperature co-fired ceramic (LTCC) materials or high temperature co-fired ceramic (HTCC) materials and related processes. In one embodiment, submount 12 can be individually cast from a thin green ceramic tape and subsequently fired. Submount 12 can also be cast and subsequently fired and singulated from a panel of submounts formed from a thin green ceramic tape. Where used, the ceramic tape can comprise any ceramic filler material known in the art, for example, submount 12 can comprise a glass ceramic, such as $Al_2O_3$ or aluminum nitride (AlN) having 0.3 to 0.5 weight percent of glass frits. The glass frits can be used as a binder and/or sintering inhibitor within the ceramic tape when the tape is fired. Higher $Al_2O_3$ concentration can be used for better thermal conductivity.

In some aspects, the green tape can be formed by casting a thick layer of a slurry dispersion of the glass frit, ceramic filler, one or more additional binders, and a volatile solvent. The cast layer can be heated at low temperatures to remove the volatile solvent. A green ceramic tape used for submount 12 can advantageously comprise any thickness desired, thus contributing to a thinner size when desired. Submount 12 can further comprise a ceramic material having any of a variety of scattering particles contained therein. Examples of suitable scattering particles can for example comprise particles of $Al_2O_3$, $TiO_2$, $BaSO_4$, and/or AlN. Submount 12 can be produced by thin- or thick-film processing techniques available at and including products available from CoorsTek, headquartered in Golden, Colo. Such substrates or submounts 12 can optionally be fired along with other materials (e.g., zirconia, $ZrO_2$) to further improve optical and mechanical properties.

Submount 12 can comprise any suitable size, shape, orientation, and/or configuration. For illustration purposes, a substantially square shaped submount 12 is shown, however, any shape of submount is contemplated herein, for example, any one of a substantially rectangular, circular, oval, rounded, regular, irregular, or asymmetrically shaped submount is also contemplated herein. Submount 12 can for example comprise a substantially square or rectangular shape having at least one side of approximately 25 millimeters (mm) or less such as approximately 20 mm or less; approximately 15 mm less; approximately 10 mm or less; approximately 6 mm or less; approximately 3 mm or less; and/or a submount having at least one side of approximately 1 mm or less. Submount 12 can for example comprise a thickness of approximately 2 mm or less, such as approximately 1 mm or less; approximately 0.5 mm or less; or approximately 0.25 mm or less. In one aspect, submount 12 can comprise a thickness of approximately 0.63 mm.

As FIG. 3 illustrates, at least one optional coating and/or layer of material 16 can be disposed over submount 12. In one aspect, layer 16 can be applied to submount 12 prior to die attaching or bonding LED chip 14 to submount 12. Layer 16 can comprise any suitable material for increasing the bonding and/or amount of heat conducted between LED chip 14 and submount 12. For example, layer 16 can comprise a silicone, epoxy, and/or any other polymer known to those having skill in the art. Alternatively, layer 16 can comprise a ceramic or metal material. In addition, layer 16 can contain reflective particles therein, such as $Al_2O_3$, $TiO_2$, $ZrO_2$, or any other reflective particle known to those having skill in the art. Layer 16 can be fired with a flux or without a flux (i.e., in a sintering process). Furthermore, once applied, layer 16 can be mechanically modified, such as by lapping, polishing, grinding, or other mechanical modification. More than one layer 16 of material is also contemplated herein. The one or more intervening layer(s) can comprise a width that is approximately equal to, less than, or greater than the width of at least one LED chip 14. As an example, layer 16 is shown with a width that is substantially the same as or approximately equal to the width of LED chip 14, however, the broken lines indicate where layer 16 could extend to.

As FIGS. 2 and 3 further illustrate, LED chip 14 can comprise substantially straight and/or beveled (e.g., sloped or inclined) lateral sides and can comprise any shape, size, dimension, structure, build, and/or color. More than one LED chip 14 can also be used. Where used, multiple chips can comprise the same shape, size, dimension, structure, build and/or color or different shapes, sizes, dimensions, structures, builds, colors, and/or combinations thereof. LED chips 14 can comprise a growth substrate or a carrier substrate, and can comprise a vertically structured chip (e.g., anode and cathode on opposing surfaces of LED chip 14) or a horizontally structured chip (e.g., anode and cathode on a same surface). For illustration purposes, a horizontally structured LED chip 14 is illustrated, where both the anode and the cathode can be disposed on the upper surface in the form of two bond pads. However, both contacts (e.g., the anode and cathode) could be disposed on a bottom surface of the LED chip 14 and/or on opposing top and bottom surfaces as well.

LED chip 14 can comprise any size and/or shape. LED chip 14 can be substantially square, rectangular, regular, irregular, or asymmetrical in shape. In one aspect, LED chip 14 can for example comprise a footprint where at least one side measures approximately 1000 µm or less, such as approximately 900 µm or less; approximately 700 µm or less; approximately 600 µm or less; approximately 500 µm or less; approximately 400 µm or less; approximately 300 µm or less; approximately 200 µm or less; approximately 100 µm or less; and/or combinations thereof where multiple LED chips 14 are used.

Referring to FIGS. 2 and 3, notably, light emitter components 10 and 20 can further comprise at least one electrical contact 18 that is completely external, e.g., disposed along exterior surfaces of submount 12. That is, electrical contact 18 can be disposed over, along, and/or cover portions of one or more external surfaces of submount 12, such as surfaces denoted 1-3, where at least one surface an include an external lateral surface (e.g., surface 2). In one aspect, this can advantageously improve time and cost associated with processing components descried herein by foregoing the need to mold electrical contacts within submount 12 and/or pass electrical current internally from a top contact to a bottom contact by creation of multiple thru-holes or vias. Notably, electrical contact 18 can comprise an electrically conductive top contact portion 22 and an electrically conductive bottom contact portion 24. An electrically conductive intermediate back or side contact portion 26 can be disposed therebetween, for passing electrical current directly between the top contact portion 22 and the bottom contact portion 24. In one aspect, side contact portion 26 can physically, electrically, and/or thermally connect top contact portion 22 and bottom contact portion 24.

Electrical contact 18 including each of top, bottom, and side portions 22, 24, and 26, respectively, can be electroplated. Any suitable type of adhesion layer, such as for example titanium (Ti), can be disposed between submount 12 and electrical contact 18. Electrical contact 18 can comprise a metallic body or portion of material that can be bent and/or crimped about a portion of submount 12 to form top, bottom, and side portions 22, 24, and 26, respectively. In further aspects, side contact portion 26 can comprise an exposed electrically conductive via, a conductive paste, ink, epoxy, metal, and/or end cap. Notably, side contact portion 26 can comprise a path for conveying electrical signal between top contact portion 22 and bottom contact portion 24. Thus, side contact portion 26 can physically and electrically connect top contact portion 22 and bottom contact portion 24. This can advantageously allow for bottom contact portion 24, side contact portion 26, or combinations thereof to be mounted over and electrically communicate with an outside power source (not shown), such that the components 10 and 20 can be mounted in a plurality of different configurations and/or allow for a plurality of components 10 and 20 to be mounted in a plurality of different orientations or configurations within a lighting fixture or lighting device.

Portions of bottom and side contact portions 24 and 26, respectively, can be configured to thermally communicate with an external substrate or heat sink which can be the same as and/or different than the outside power source. This can advantageously allow one or more portions of components 10 and 20 to electrical and/or thermally communicate with one or more external substrates or surfaces via one or more portions of external electrical contact 18. In one aspect, portions of bottom and side contact portions 24 and 26, respectively, either alone or in combination, can be soldered to an external substrate, surface, heat sink, power source, or combinations thereof.

In one aspect, emitter components 10 and 20 can comprise two electrical contacts 18 configured to pass electrical signal or current from the outside power source (not shown) such as a circuit board, a PCB, a MCPCB, or other electrical source into the one or more LED chips 14. Portions of electrical contacts 18 can be soldered, glued, or otherwise physically, electrically, and/or thermally connected to the outside power source. LED chips 14 can illuminate upon receiving electrical current passed between at least two electrical contacts 18. In one aspect, a first electrical contact 18 can comprise an anode and a second electrical contact 18 can comprise a cathode. The anode and cathode can be configured to electrically connect with LED chip 14 via wirebonds 28. A first end 30 of wirebond 28 can be configured to physically and electrically connect with an electrical contact (e.g., a bond pad) disposed on LED chip 14. An opposing end of wirebond 28 can physically and electrically connect with and/or directly or indirectly attach to electrical contact 18. Wirebond 28 can comprise any suitably electrically conductive material such as a metal, in one aspect, a wire comprising gold (Au), a Au-alloy, or Ag or Al.

Notably, electrical contact 18 can comprise a wraparound contact (also referred to as a "lead") which can wrap about portions of submount 12. That is, each electrical contact 18 can be disposed along portions of at least three external sides, edges, or surfaces (denoted 1-3) of submount 12. This feature can allow submount 12 to be incorporated into several different customized SMD type components and packages. In one aspect, side contact portion 26 can be disposed along a surface that is substantially orthogonal to surfaces having top and/or bottom contacts 22 and 24. Electrical contacts 18 can adapt to and conform to any cross-sectional shape of submount 12. For example and for illustration purposes only, electrical contacts 18 are illustrated as conforming to a substantially rectangular shaped cross-section. That is, contacts 18 can conform to the rectangular shape along at least three sides. However, contacts 18 that can be disposed over and cover portions of more than three sides and/or conform to other non-rectangular shapes and/or conform to differently angled surfaces are also contemplated herein. For example, contacts 18 can comprise more than one side contact portion 26 adapted to conform to a submount 12 that is a multi-faceted, multi-angled, and/or has a non-rectangular cross-sectional shape. Side contact portion 26 can electrically connect top and bottom contact portions 22 and 24, and can allow components 10 and 20 to comprise side and/or bottom SMD. In one aspect, side contact portion 26 can comprise a same material as top and bottom contact portions 22 and 24, respectively. In other aspects, side contact portion 26 can comprise a different material than top and bottom contact portions 22 and 24, respectively. In further aspects, each of top, bottom, and side contact portions 22, 24, and 26 can comprise different materials.

FIG. 3 illustrates component 20, further comprising one or more layers of material 32 disposed over at least a portion of electrical contact 18. In one aspect, electrical contacts 18 can be electroplated, coated, or layered with a wirebondable material for improving adhesion between wirebond 28 and electrical contact 18. More than one layer of material 32 is also contemplated herein. For example, layer 32 can comprise an adhesion promoting layer, such as electroless nickel and immersion gold materials (i.e., ENIG) for improving the bonding or adhesion between wirebonds 28 and electrical contact 18. For illustration purposes, layer 32 is shown extending at least partially over top contact portion 22; however, layer 32 can also optionally extend over portions of side and/or bottom contact portions 26 and 24, respectively. In addition, and as noted above with respect to FIG. 3, component 20 can further comprise one or more intervening layers of material 16 disposed between LED chip 14 and submount 12 for improving bonding and/or heat conduction therebetween. Material 16 may be conductive for example in a situation where the chip is vertical or otherwise a conductive material is desired. Layers 16 and 32 can comprise the same and/or different materials.

Still referring to FIGS. 2 and 3, electrical contact 18 can comprise one or more layers of electroplated material. One or more external surfaces can be electroplated with one or more layers of material before, after, or during the die attachment of one or more LED chips 14. In one aspect, top, bottom, and side contact portions 22, 24, and 26, respectively, of electrical contact 18 can comprise a layer of electroless silver (Ag) and one or more layers of copper (Cu)

that have been electroplated via any suitable and known processing technique. Cu may not stick well to ceramic, so a layer of Ti can be used for adhesion between a Cu layer and a ceramic substrate. In other aspects, electrical contact 18 can comprise a layer of immersion silver and one or more layers of Cu electroplated via any suitable and known processing technique. In yet further aspects, top, bottom, and side contact portions 22, 24, and 26, respectively, of electrical contact 18 can comprise layers of electroplated nickel (Ni) and Ag with one or more layers of electroplated Cu. In further aspects, top, bottom, and side contact portions 22, 24, and 26, respectively, of electrical contact 18 can comprise one or more layers of alternating electroplated Ni and Ag. Electrical contact 18 can also be electroplated with one or more layers of electrolytic or immersion gold (Au) either alone or in combination with layers of electroplated Ag, Ni, and/or Cu. Electrical contact 18 can further comprise one or more layers of electroplated palladium (Pd) either alone or in combination with layers of electroplated Ag, Ni, Cu, and/or Au.

Top, bottom, and side contact portions 22, 24, and 26, respectively, can be plated with the same and/or different materials. For example, in one aspect, each of top, bottom, and side contact portions 22, 24, and 26, respectively, comprise the same layer(s) of material or electroplated metal(s). In further aspects, top and bottom contact portions 22 and 24, respectively, can be electroplated with a first material and/or one or more layers selected from Ag, Ti, Ni, Cu, Au, Pd, and/or combinations thereof, and side contact portion 26 can be electroplated with a second material and/or one or more layers selected from Ag, Ti, Ni, Cu, Au, Pd, and/or combinations thereof, where second material is different than first material. In further aspects, side contact portion 26 can comprise an area of conductive paste, ink, epoxy, metal, an exposed metallic via (e.g., FIGS. 6A and 7A), and/or an end cap.

Figure 4:
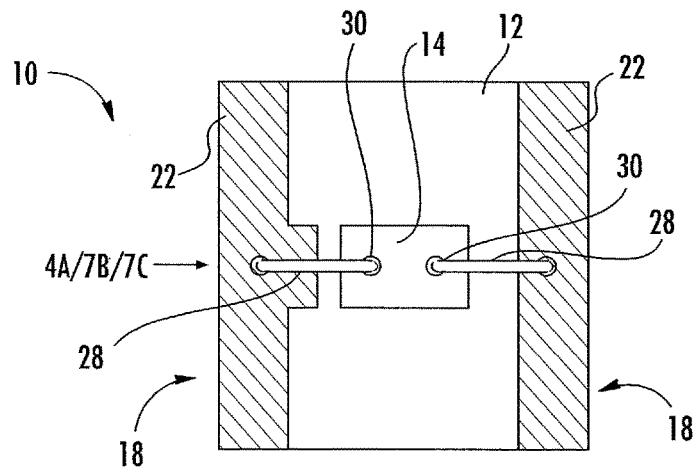
FIG. 4 is a top view of a submount based light emitter component according to the disclosure herein.
Figure 5A:
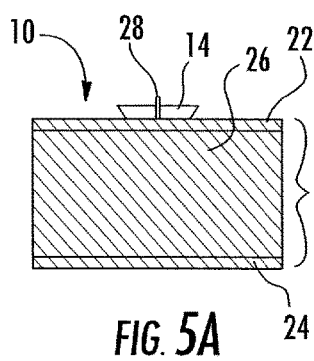
FIGS. 5A to 5C are side views of further embodiments of submount based light emitter components according to the disclosure herein.
Figure 5B:
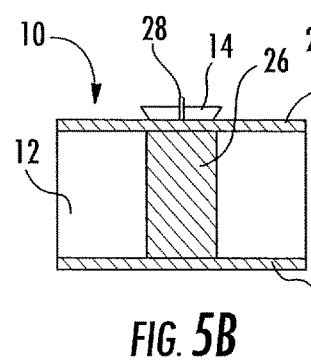
Figure 5C:
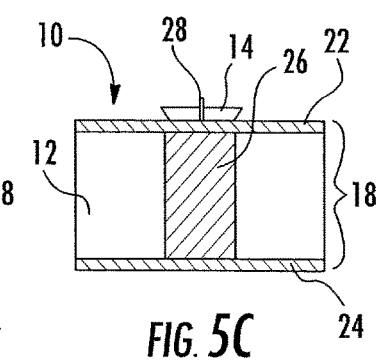

FIG. 4 illustrates a top view of the submount based SMD type component 10. FIGS. 5A to 5C illustrate various alternative side views of component 10. As FIG. 4 illustrates, LED chip 14 can be disposed over and mounted either directly or indirectly to a non-metallic submount 12. Notably, this technology allows for substantially flat submounts 12 to be formed into a multitude of different and/or customized packages or components without having to incur expenses associated with custom fabricated ceramic packages. As noted above, component 10 can comprise a ceramic based light emitter component (e.g., comprising a ceramic based submount) for providing improved light scattering and reflection and, therefore, improved efficiency, brightness, and light extraction capabilities. Ceramic based submounts may also desirable for use in light emitter components described herein for improved thermal management properties. For example, $Al_2O_3$ materials exhibit relatively low thermal resistance, low moisture sensitivity, superior reliability at high temperature environments, and the superior ability to dissipate heat.

LED chip 14 can electrically connect with two top contact portions 22 of two electrical contacts 18 via wirebonds 28. The two top contact portions 22 can comprise opposing electrical polarities (e.g., an anode and a cathode). LED chip 14 can comprise a horizontal chip having two electrical contacts of opposing electrical polarities (e.g., anode and cathode in the form of bond pads) on an upper surface of the LED chip 14, such that the upper surface of chip can be wirebonded to top contact portions 22 for passing electrical current from the top contact portions 22 into the LED chip 14 for illuminating the LED chip 14. As FIG. 4 illustrates, top contact portions 22 can comprise different shapes or surface designs for denoting electrical polarity (e.g., the anode or the cathode) of component 10.

Notably, as the side views 5A to 5C illustrate, component 10 can comprise a wraparound or fully external electrical contact 18 having a top contact portion 22 connected to a bottom contact portion 24 via a side contact portion 26. As FIGS. 5A and 5B illustrate, top contact, bottom contact, and side contact portions 22, 24, and 26, respectively, can comprise the same material, as denoted by the same shading. FIG. 5C shows an embodiment where top and bottom contact portions 22 and 24 can comprise a first material that is different than the material of side contact portion 26 as denoted by the different shading. FIG. 5A further illustrates, in one embodiment side contact portion 26 can extend substantially the full width and cover substantially the full external, lateral side surface of component 10. As FIGS. 5B and 5C illustrate, side contact 26 can also extend over a portion of the width, and may comprise a portion that covers less than the full width, or less than the full lateral side surface area of component 10. In one aspect, each of top, bottom, and side contact 22, 24, and 26, respectively, can comprise electroplated layers of metal(s) comprising one or more elements selected from the group of electroplated Ag, Ti, Ni, Cu, Au, and/or Pd.

Figure 6A:
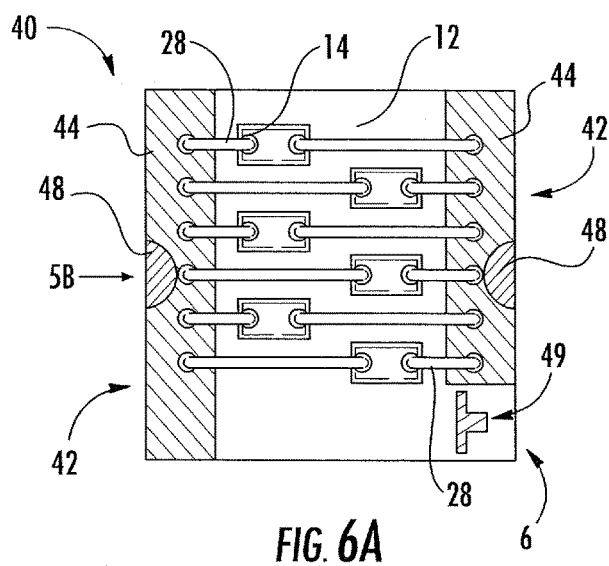
FIGS. 6A and 6B are top and side views, respectively, of a further embodiment of a submount based light emitter component according to the disclosure herein.
Figure 6B:
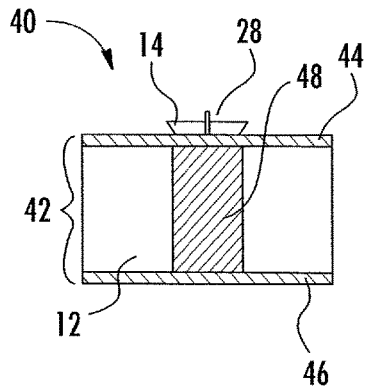

FIGS. 6A and 6B illustrate a further embodiment of a submount based SMD type of light emitter component, generally designated 40. Light emitter component 40 can be similar in form and function to component 10, but can have more than one LED chip 14 and/or a side contact portion optionally formed by exposing metal disposed in an internal thru-hole or electrically conductive via. Emitter component 40 can comprise a non-metallic and/or ceramic based submount 12 with more than one LED chip 14 mounted to submount 12. Notably, submount 12 can comprise the building block for several different components described herein, and can allow for a multitude of different components to be customized and formed by varying, for example, the type of optical element used (e.g., a lens or encapsulant), the placement, angles, and/or sizes of reflector cavities used, and/or other factors such as type of phosphor and number of LED chips 14 used. In one aspect, emitter component 40 can comprise more than two LED chips 14, such as three LED chips 14, four LED chips 14, five LED chips 14, six LED chips 14, or more than six LED chips 14. Each LED chip 14 can be electrically connected in parallel, series, or combinations thereof. For illustration purposes, each chip 14 is shown as electrically connected in parallel with the remaining chips, however, chips connected in series and/or arrangements of series and parallel chips are contemplated herein.

Component 40 can further comprise an electrical contact 42 having a top contact portion 44, a bottom contact portion 46 and a side contact portion 48 connecting the top and bottom contact portions 44 and 46, respectively. Notably, side contact portion 64 can comprise an exposed thru-hole or via, and can comprise an area of exposed metal, such as Ag. The metal can be exposed by sawing, dicing, etching, cutting, or otherwise separating and exposing the metal inside the via, such that the metal is on an outer surface of submount 12. In one aspect, a large panel of ceramic material can be provided (e.g., P, FIG. 1) and one or more vias (e.g., V, FIG. 1) can be provided therein. The vias can be sawn or cut through such that they are exposed along an outer surface of submount 12 when individual submounts are singulated from the large panel.

In one aspect, exposing the electrically conductive via can position a portion of the via along one or more external lateral sides of the submount 12 for electrically connecting top contact portion 44 to bottom contact portion 46.

For example, submount 12 can be singulated from a large ceramic panel comprised of a plurality of thru-holes filled with metal, also known as electrically conductive vias. During singulation of submount 12, the panel can be cut or sawn such that the vias are cut substantially in half and/or quartered thereby exposing the metal inside. Top and bottom contact portions 44 and 46, respectively, can be electroplated to top and bottom surfaces of submount 12 either before or after isolating the submount 12 from the panel. The exposed vias can comprise side contact portions 48 for electrically connecting top and bottom contact portions 44 and 46. Notably, side contact portions 48 can be disposed along an external surface of submount 12, such that submount 12 can electrically and/or thermally communicate with one or more external substrates or heat sinks via side contact portion 48 and/or bottom contact portion 46. Electrical contact 42 can be disposed along portions of at least three external surfaces of submount 12, and can be electrically connected to the more than one LED chip 14. As FIG. 6A illustrates, a symbol or indicator generally designated 49 can be disposed in the top surface and/or comprise a portion of top contact portion 44 of submount 12. Indicator 49 can denote the electrical polarity of that portion of component, for example, indicating the anode or cathode to assure proper electrical connection of the LED chips 14.

FIGS. 7A and 7B illustrate a further embodiment of a submount based SMD type light emitter component, generally designated 50. Component 50 can be similar in form and function to component 40. For example, component 50 can comprise one or more side contact portions 58 formed by sawing or cutting through vias disposed in a large ceramic based panel during singulation of each individual submount 12. In this embodiment, component 50 can comprise at least two electrical contacts 52 disposed on opposing portions of submount 12. Each electrical contact 52 can comprise a top contact portion 54, a bottom contact portion 56, and one or more side contact portions 58. Top and bottom contact portions 54 and 56 can comprise areas of applied metal. In one aspect, top and bottom contact portions 54 and 56 can comprise areas of electroplated metal(s) selected from the group of Ag, Ti, Ni, Cu, Au, Pd, and/or combinations thereof.

Notably, electrical contacts 52 can comprise fully external contacts, which can wraparound submount 12 such that contact is disposed along at least three external sides or surfaces of component 50. Side contact portions 58 can comprise areas of exposed metal. In one aspect, side contact portions 58 comprise areas of Ag, which have been exposed during singulation of submount 12. For example, a large, non-metallic panel can be provided. A plurality of metal filled vias can be provided in the panel. When singulating each submount 12, the panel can be cut or sawn such that each via is cut into and exposed, such that the exposed vias form one or more side contacts 58. In one aspect, four side contacts 58 can be formed by exposing four vias. At least two side contacts 58 can be disposed along a same lateral side, for example, along opposing outermost edges of the lateral side. In one aspect, side contact portions 58 can be disposed in corner areas of submount where two sides meet. More than one side contact 58 can advantageously provide more than one area where component 50 and an external power source or heat sink (not shown) can electrically and/or thermally connect. Thus, components provided herein can physically, electrically, and/or thermally connect to more than one external substrate, along more than one side, where desired. For example, the more than one side contact portion 58 can be soldered to more than one external substrate, either alone and/or in addition to bottom contact portions 56 being soldered to an external substrate.

Figure 8B:
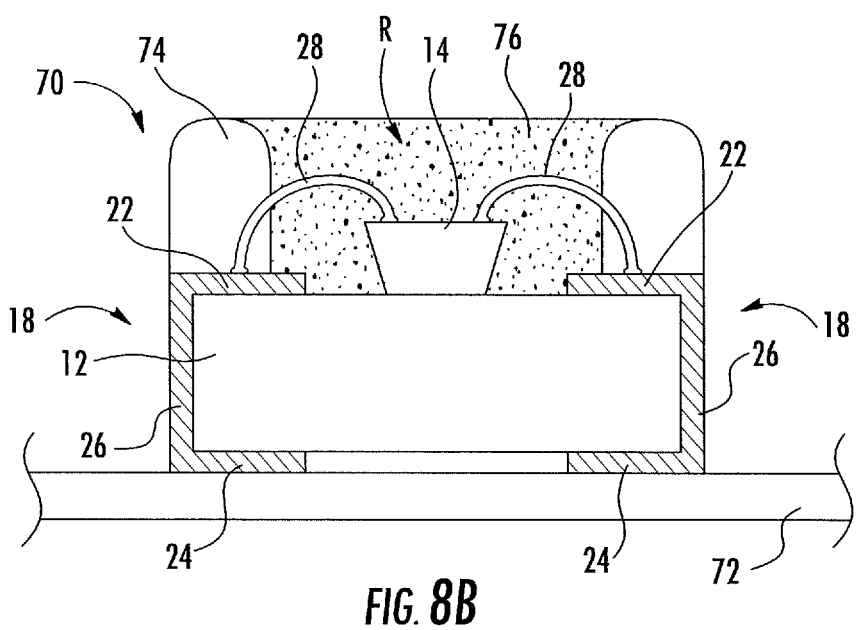
Figure 8C:
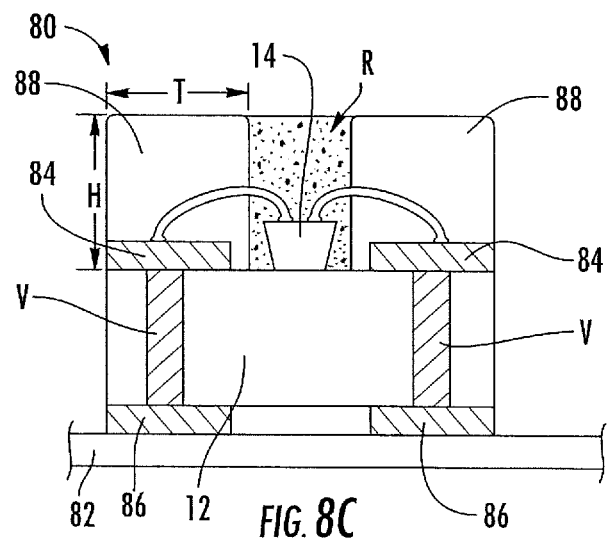
Figure 8D:
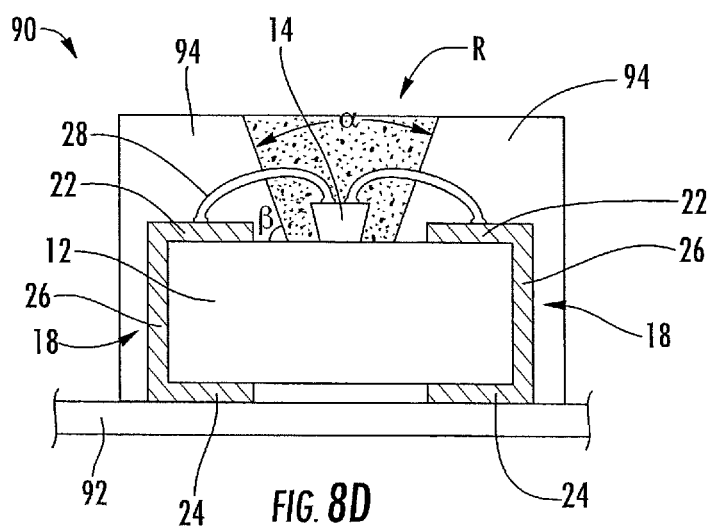

FIGS. 8A to 8D illustrate further embodiments of submount based SMD type light emitter components. Notably, each component comprises a submount 12 about which the rest of the SMD type component can be built. For example, customized reflector cavities can be disposed over submounts 12, where each reflector cavity can comprise a retention material or a dam. Notably, retention materials can comprise a silicone, a plastic, an epoxy, a thermoset material, an injection molded plastic, or combinations thereof which can be different than the ceramic based submount 12. FIGS. 8A and 8B illustrate light emitter components, generally designated 60 and 70, respectively, where each component further comprises a customized optical element such as a lens or encapsulant material provided for obtaining a desired beam pattern or emission. FIGS. 8C and 8D illustrate components, generally designated 80 and 90, where each component further comprises a customized reflector cavity provided for obtaining desired light emission.

Referring to FIG. 8A, light emitter component 60 can be disposed over an external substrate 62. In one aspect, external substrate 62 can comprise a PCB, a MCPCB, a circuit, a heat sink, or a portion of a light fixture. In one aspect, emitter component 60 can comprise electrical contacts 18, comprising top contact portions 22, bottom contact portions 24, and side contact portions 26. Top, bottom, and side contact portions 22, 24, and 26, respectively, can comprise areas of metal applied by chemically or physically depositing metal to a portion of the external sides or surfaces of submount 12. In one aspect, top, bottom, and side contact portions 22, 24, and 26, respectively, can comprise areas of electroplated metal(s), for example, a metal chosen from the group consisting of Ag, Ti, Ni, Cu, Au, and/or Pd. In one aspect, top and bottom contact portions 22 and 24 can comprise areas of electroplated metal, and side contact portion 26 can comprise an area of exposed metal, such as a sawn or cut thru-hole or electrically conductive via (FIGS. 6A, 7A). Side contact portion 26 could also comprise an area of a conductive paste, ink, epoxy, metal, and/or end cap. At least one side contact portion 26 could also optionally be connected (e.g., physically, electrically, and/or thermally) to substrate 62 or to a different substrate, where desired.

Whether or not light emitter component 60 comprises external electrical contacts, light emitter component 60 can comprise a retention member 64 that can extend partially or completely around an upper periphery of light emitter component 60 and can form a reflection cavity therebetween. Retention member can for example comprise a cup or dam that can for example be configured to retain an optical element 66, such as a lens. Retention member 64 can comprise a thin ring that helps encapsulant form a desirable shape or configuration, such as for example a dome shape. In this regard, retention member 64 can comprise an anti-wetting property and be a non-wetting ring, for example, and can have a high contact angle. Retention member 64 can in some aspects comprise a customized reflector cavity of minimal height configured to reflect light from the one or more LED chips 14. Light emitter component 60 can comprise one or more optional recesses 68 denoted for example in broken lines. Recesses 68 can comprise pre-cut grooves for retaining optical element and/or encapsulant within the top surface of submount 12 via surface tension. Optical element 66 can comprise a domed lens for producing a certain shape or beam pattern of light emission. The lens can be molded and cured using known processes. Optical element 66 can be formed directly and/or indirectly over a top surface of submount 12, and can be disposed over at least one LED chip 14. An array of lenses or optical elements 66 can be molded and/or positioned over a corresponding array of LED chips 14.

Optical element 66 can provide both environmental and/or mechanical protection of light emitter component 60. An optional layer of optical conversion material (not shown) can be applied directly over the one or more LED chips 14 and/or over one or more surfaces of optical element 66 (e.g., an inner or outer surface) for producing cool and/or warm white output. Optical conversion material can comprise one or more phosphors or lumiphors (e.g., yellow, red, and/or green phosphor) which can be activated by light emitted from the one or more LED chips 14.

LED chips 14 described herein can embody solid state emitters used alone and/or in combination with optical conversion material comprising, for example, phosphors or lumiphors to emit light of various colors, color points, or wavelength ranges, such as light that is primarily white, blue, cyan, green, yellow, amber, or red. In one aspect light emitter components described herein can comprise one or more LED chips 14 that are primarily blue, which when illuminated, can activate a yellow phosphor disposed over the one or more chips 14 (e.g., phosphor can be at least partially directly disposed over LED chips 14 and/or on a portion of light emitter component 60 that is disposed over LED chips 14 such that the combined light output of the chips is of a desired color point. In alternative embodiments, a primarily red LED chip 14 can be included in emitter components described herein and can be used alone and/or combination with a blue chip with yellow phosphor. In one aspect, a red LED chip 14 can also optionally be disposed below a phosphor, encapsulant, lens and/or combinations thereof, such as optical element 66 with a phosphor layer for mixing to produce warm white output. In yet a further embodiment, component 60 can comprise more than one LED chip 14 such as a plurality and/or array of LED chips 14. Each chip in the plurality or array of LED chips 14 can comprise approximately the same wavelength (e.g., selected from the same targeted wavelength bin). In the alternative, at least a first LED chip 14 of the plurality of chips can comprise a different wavelength than at least a second LED chip of the plurality of chips (e.g., at least a first LED chip 14 could be selected from a different targeted wavelength bin than at least one other LED chip 14).

FIG. 8B illustrates a submount based SMD type light emitter component 70 disposed over an external substrate 72, such as a circuit, PCB, MCPCB, or a heat sink. In one aspect, light emitter component 70 can be electrically and thermally connected to substrate 72 via solder (not shown). Emitter component 70 can comprise a retention material 74, such as a dam. Retention material 74 can provide or form a customized reflector cavity generally designated R, where the placement, height, angle, and/or thickness of the retention material 74 can be customized for customized light emission. Customized components can be also provided, for example, by varying the type or placement of optical element, the number and type of LED chips 14, and/or the type(s) of phosphor used. In one aspect, retention material 74 can comprise a dispensed material, such as a dispensed silicone, epoxy, or plastic material that can be optionally tinted white (e.g., via addition of $TiO_2$) for increasing the amount of light reflected and/or light emission from component 70. Component 70 can further comprise an optical element 76. Optical element 76 can comprise a layer of encapsulant filling material. An optional layer of optical conversion material (not shown) can be disposed over LED chips 14 and/or within optical element 76. In one aspect, optical element 76 can comprise a layer of silicone encapsulant or epoxy having a substantially flat surface. Concave or convex surfaces are also contemplated herein. Light emitter component 70 can comprise at least one LED chip 14 configured to activate a yellow, red, and/or green optical conversion material (e.g., yellow, red, and/or green phosphor, not shown) for producing cool and/or warm white output. In one aspect, optical element 76 can comprise a liquid curable silicone material, an epoxy material, or any encapsulant material such as a methyl or phenyl based encapsulant material.

FIG. 8C illustrates a further embodiment of a customized light emitter component generally designated 80. Light emitter component 80 can comprise a non-metallic submount 12 based component configured to mount directly to an underlying heat sink or circuit component 82. Component 80 can comprise upper contact portions 84 and bottom contact portions 86. Upper and bottom contact portions 84 and 86, respectively, can be electrically and/or thermally connected by one or more electrically conductive vias V. Component 80 can further comprise a retention material 88 or dam. Notably, retention material 88 can provide a customized reflection cavity R. A height H and/or a thickness T of retention material 88 can be customized to achieve a desired size and shape of reflection cavity R for a desired light emission. Notably, varying the height H and/or thickness T of retention material 88 can allow for a multitude of differently sized and/or shaped reflection cavities and, therefore, a plurality of components to be formed over submount 12.

FIG. 8D illustrates a further embodiment of a customized submount based SMD type light emitter component, generally designated 90. Light emitter component 90 can comprise a non-metallic submount 12 based component configured to mount directly to an underlying heat sink or circuit component 92. Notably, component 90 can comprise a retention material 94 can provide a customized reflector cavity R. Retention material 92 can comprise a first material that is different than the material of the ceramic based submount 12. For example, in one aspect retention material 92 can comprise a dispensed silicone, epoxy, thermoset, and/or plastic material. In further aspects, retention material 92 can comprise an injection molded plastic material.

Notably, retention material 92 can be disposed over a portion of submount 12 and can be customized in size, shape, placement, and/or angle(s). A first angle α can comprise the angle between sidewalls of reflector cavity R, and can vary between approximately 0° (e.g., substantially parallel, vertical walls) and approximately 90°, such as between approximately 0° and 15°; approximately 15° and 30°; approximately 30° and 60°; and greater than approximately 60°. A second angle β can comprise an angle at which one or more walls of reflector cavity R are inclined with respect to submount 12. Second angle β can comprise an acute angle varying between approximately 1° and 90°. Second angle β can comprise any desired angle, such as for example an obtuse angle. Any variation of second angle β is contemplated herein and can be customized for light emission and extraction. In one aspect, second angle β can comprise an acute angle between approximately 1° and 15°;

approximately 15° and 30°; approximately 30° and 45°; approximately 45° and 60°; and greater than approximately 60°.

Retention material 94 can be placed over a portion of submount 12, and can optionally extend over and cover one or more portions of external surfaces of submount 12 and/or portions of electrical contacts 18. For example, in one aspect, retention material 94 can extend down the body of submount 12, to where component 90 connects with heat sink or circuit component 92. That is, retention material 94 can optionally cover outer portions of submount 12 and/or electrical contacts 18. Retention material 94 can be formed such that it provides a substantially circular reflector cavity R, a substantially square reflector cavity R, or any non-circular or non-square shape such as oval. Asymmetrical reflector cavities are also contemplated herein. Retention material 94 can vary in placement, size, shape, and/or angle for providing customized submount based SMD type components, where reflector cavity R and retention material 94 are not ceramic based materials.

Figure 9:
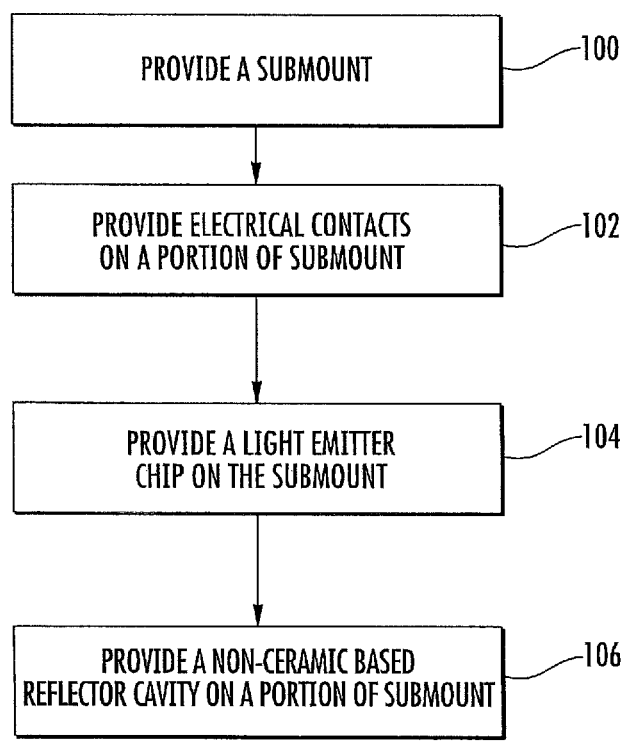
FIG. 9 is a flow chart illustrating exemplary steps for providing a submount based light emitter component according to the disclosure herein.

FIG. 9 is a flow chart illustrating exemplary steps that can be utilized for providing a submount based light emitter component according to the disclosure herein. Step 100 comprises providing a submount. As described herein, the submount can comprise a non-metallic submount material(s) that is/are substantially reflective and substantially non-absorbing of light emitted by one or more LED chips. In one aspect, submount can comprise $Al_2O_3$. In step 102, electrical contacts can be provided on a portion of submount. SMD type devices can utilize bottom contact portions for directly connecting with and mounting to external power sources, heat sinks, or circuitry components. Electrical contacts can be wholly external the submount, such as wraparound contacts 18 (FIG. 2). In step 104, a light emitter chip is provided on the submount. A light emitter chip can comprise a LED chip of any size, shape, build, structure, and/or color. More than one light emitter chip can also be provided. Step 106 comprises providing a customized, non-ceramic based reflector cavity on a portion of the submount. The height, thickness, size, shape, angle, and/or position of reflector cavity can be customized to provide a plurality of different submount based components without the need for custom fabricated ceramic packages with ceramic reflector cavities. The reflector cavity can comprise a different material than the submount, for example, a silicone, epoxy, thermoset material, injection molded plastic, and/or combinations thereof. In one aspect, providing the reflector cavity can comprise dispensing a silicone, epoxy, or plastic retention material, thereby forming the reflector cavity. An encapsulant, such as silicone or epoxy and one or more phosphors can optionally be provided in the reflector cavity. Step 106 can be performed before chip placement if desired. A final step of encapsulating the chip with an encapsulant, such as for example silicon that can optionally comprise phosphor as desired, can be performed if desired.

Embodiments of the present disclosure shown in the drawings and described above are exemplary of numerous embodiments that can be made within the scope of the appended claims. It is contemplated that the customized novel light emitter components and methods of making the same can comprise numerous configurations other than those specifically disclosed.

What is claimed is:
1. A method of providing a surface mount device (SMD) light emitter component, the method comprising:
providing a ceramic based submount, wherein the submount comprises a single body of material that is devoid of electrical conductors;
providing at least one electrical contact that physically contacts at least one external surface of the submount;
providing at least one light emitter chip on the submount; and
dispensing a volume of material over at least one side of the at least one electrical contact to form a non-metallic retention material disposed about a perimeter of the submount and defining a reflector cavity directly on a portion of the submount;
dispensing a filling material in the reflector cavity and over the at least one light emitter chip,
wherein:
the retention material is a dispensed material comprising a silicone material, an epoxy, a plastic material, or a thermoset material;
the retention material is adapted to receive and contact the filling material;
the retention material has at least one curved upper edge, which is contiguous with an upper surface of the filling material;
the retention material is a different material than the ceramic based submount; and
the retention material is thicker than the at least one light emitter chip for retaining the filling material over the at least one light emitter chip; and curing the retention material and the filling material.

2. The method of claim 1, wherein the at least one electrical contact is disposed along portions of at least three external surfaces of the submount.

3. The method of claim 1, wherein the retention material is dispensed directly over portions of the submount and the at least one electrical contact.

4. The method of claim 1, wherein retention material comprises a reflective retention material.

5. The method of claim 1, wherein the ceramic based submount comprises alumina ($Al_2O_3$).

6. The method of claim 1, wherein the at least one light emitter chip comprises a light emitting diode (LED) chip.

7. The method of claim 1, wherein the at least one light emitter chip comprises two or more light emitting diode (LED) chips.

8. The method of claim 7, wherein the at least one light emitter chip comprises six LED chips.

9. The method of claim 1, wherein the at least one electrical contact is formed by applying metal to at least a portion of one or more external lateral sides of the submount for electrically connecting a top contact portion of the at least one electrical contact to a bottom contact portion of the at least one electrical contact.

10. The method according to claim 9, wherein applying metal comprises electroplating at least a portion of the one or more external lateral sides of the submount.

11. The method according to claim 9, wherein applying metal comprises chemically or physically depositing metal to at least a portion of the one or more external lateral sides of the submount.

12. The method according to claim 1, wherein the at least one light emitter chip is mounted directly to a top surface of the submount with an adhesive.

13. The method according to claim 1, wherein the reflector cavity has an angled inner wall.

14. The method according to claim 1, wherein the filling material comprises an encapsulant.

15. A surface mount device (SMD) submount based light emitter component comprising:
- a ceramic based submount, the submount comprising a single, monolithic body of material which is devoid of internal electrical conductors;
- at least one electrical contact disposed along portions of at least three external surfaces of the submount;
- at least one light emitter chip disposed on the submount; and
- a non-metallic retention material defining a reflector cavity disposed about the at least one light emitter chip, wherein the retention material is dispensed as a liquid over at least one side of the at least one electrical contact and is disposed about a perimeter of the submount; and
- a filling material disposed in the reflector cavity and over the at least one light emitter chip, wherein:
  - the retention material comprises a dispensed material, comprising a silicone material, an epoxy, a plastic material, or a thermoset material;
  - the retention material is adapted to receive and contact the filling material;
  - the retention material has at least one curved edge which is contiguous with the filling material;
  - the retention material comprises a wall that is disposed around the at least one light emitter chip, wherein the wall comprises an upper edge with a curved sectional shape that is contiguous with an upper surface of the filling material;
  - the retention material is a different material than the ceramic based submount; and
  - the retention material is thicker than the light emitter chip for retaining the filling material over the light emitter chip.

16. The component of claim 15, wherein the at least three external surfaces of the submount comprise a top surface, a bottom surface, and a side surface.

17. The component of claim 16, wherein the electrical contact comprises a top contact portion on the top surface, a bottom contact portion on the bottom surface, and a side contact portion on a side surface.

18. The component of claim 17, wherein each of the top, bottom, and side contact portions comprise areas of electroplated metal.

19. The component of claim 17, wherein the side contact portion comprises a sawn thru-hole.

20. The component of claim 15, wherein a thickness, height, or angle of the reflector cavity is customized.

21. The component of claim 15, wherein the at least one light emitter chip comprises a light emitting diode (LED) chip.

22. The component of claim 15, wherein the at least one electrical contact comprises one or more internal vias connecting to a bottom contact portion.

23. A surface mount device (SMD) light emitter component comprising:
- a submount comprising a single, monolithic layer of material, the submount being devoid of internal electrical conductors;
- at least one electrical contact spaced apart from the at least one light emitter chip, the electrical contact comprising a top contact portion, a bottom contact portion, and a side contact portion disposed between the top contact and the bottom contact portion, wherein the top, bottom, and side contact portions are only disposed on, and in physical contact with, external portions of the submount; and
- the at least one light emitter chip disposed over the submount and wirebonded to the top contact portion
- a non-metallic retention material defining a reflector cavity disposed directly on a portion of the submount, wherein the retention material is dispensed as a liquid over the top contact portion of the at least one electrical contact and is disposed about a perimeter of the submount; and
- a filling material disposed in the reflector cavity and over the at least one light emitter chip, wherein:
  - the retention material comprises a dispensed material, comprising a silicone material, an epoxy, a plastic material, or a thermoset material;
  - the retention material is adapted to receive, retain and contact the filling material;
  - the retention material comprises a wall that is disposed around the at least one light emitter chip, wherein the wall comprises an upper edge having a curved sectional shape, the upper edge being contiguous with the filling material; and
  - the retention material is a different material than the submount.

24. The component of claim 23, wherein a thickness, height, and/or angle of the retention material is customized.

25. The component of claim 23, wherein the side contact portion comprises an area of conductive paste, ink, epoxy, metal, an exposed metallic via, and/or an end cap.

26. The component of claim 23, wherein the top contact portion, the bottom contact portion, and the side contact portion comprise areas of electroplated metal.

27. The component of claim 26, wherein the areas of electroplated metal comprise at least one material selected from the group consisting of silver, copper, nickel, gold, palladium, titanium and combinations thereof.

28. The component of claim 23, wherein the bottom contact portion is soldered to an external substrate or heat sink.

* * * * *